US011353522B2

United States Patent
Perez et al.

(10) Patent No.: US 11,353,522 B2
(45) Date of Patent: Jun. 7, 2022

(54) MAGNETO OPTIC DISK IMAGER

(71) Applicant: Vulcan Inc., Seattle, WA (US)

(72) Inventors: Keith John Perez, Seattle, WA (US); Stephen Milton Jones, Seattle, WA (US)

(73) Assignee: Vulcan Inc., Seattle, WA (US)

( * ) Notice: Subject to any disclaimer, the term of this patent is extended or adjusted under 35 U.S.C. 154(b) by 0 days.

(21) Appl. No.: 17/068,485

(22) Filed: Oct. 12, 2020

(65) Prior Publication Data

US 2021/0025950 A1 Jan. 28, 2021

Related U.S. Application Data

(63) Continuation of application No. 16/216,880, filed on Dec. 11, 2018, now Pat. No. 10,802,085.

(51) Int. Cl.
*G11B 7/0065* (2006.01)
*G01R 33/032* (2006.01)
(Continued)

(52) U.S. Cl.
CPC ............ *G01R 33/032* (2013.01); *G06T 7/11* (2017.01); *H01L 27/14601* (2013.01); *H04N 5/23229* (2013.01); *H04N 5/335* (2013.01)

(58) Field of Classification Search
CPC .......... G11B 5/865; G11B 5/00; G11B 27/36; G11B 5/127; G11B 11/10543;
(Continued)

(56) References Cited

U.S. PATENT DOCUMENTS 3,662,364 A 5/1972 Patel et al.
5,566,032 A 10/1996 Cleveland et al.
(Continued)

FOREIGN PATENT DOCUMENTS

DE 2047393 A1 4/1971
DE 3315203 A1 11/1983

OTHER PUBLICATIONS

"Mageye—The Mobile Magnetic Field Sensor," © 2019 Matesy GmbH, Jul. 4, 2018, <https://matesy.de/en/products/magnetic-field-visualization/mageye> [retrieved Jun. 7, 2019], 6 pages.
(Continued)

*Primary Examiner* — Nabil Z Hindi
(74) *Attorney, Agent, or Firm* — Davis Wright Tremaine LLP

(57) ABSTRACT

A system determines the data stored on a portion of magnetic media by obtaining an image that represents the magnetic state of the portion of magnetic media using a magneto-optic image sensor. In an example, the image sensor is connected to a mechanism that moves over the portion of magnetic media, and the system takes a plurality of images which are stitched together into a composite image of the state of the portion of magnetic media. The system analyzes the image to identify regions that contain data, extracts the encoded data from the regions. The encoded data is decoded in accordance with an encoding scheme used by the portion of magnetic media. In some examples, a file structure is applied to the data and data files are recovered from the image. In various examples, the portion of magnetic media can be hard disk media, floppy disk media, or magnetic tape.

19 Claims, 14 Drawing Sheets

(51) Int. Cl.
  *G06T 7/11* (2017.01)
  *H01L 27/146* (2006.01)
  *H04N 5/232* (2006.01)
  *H04N 5/335* (2011.01)

(58) Field of Classification Search
  CPC .......... G11B 7/0065; G11B 2220/2504; G01R 33/032; G06T 7/11; H01L 27/14601; H04N 5/23229; H04N 5/335
  USPC ............ 360/59, 75, 114.01, 31, 25; 369/103
  See application file for complete search history.

(56) References Cited

U.S. PATENT DOCUMENTS

| | | | |
|---|---|---|---|
| 5,631,559 A | 5/1997 | Oliver et al. | |
| 5,742,036 A | 4/1998 | Schramm, Jr. et al. | |
| 6,433,952 B1* | 8/2002 | Kaaden | G11B 11/10578 360/77.12 |
| 6,493,174 B1* | 12/2002 | Stubbs | G11B 5/584 360/77.12 |
| 6,697,315 B1 | 2/2004 | Edward et al. | |
| 6,850,592 B2* | 2/2005 | Schramm | G01N 23/223 162/57 |
| 7,005,849 B2 | 2/2006 | Tse et al. | |
| 8,281,997 B2* | 10/2012 | Moran | G06K 19/086 235/449 |
| 8,659,291 B2 | 2/2014 | Heidmann | |
| 2005/0195510 A1* | 9/2005 | Skaar | G11B 5/584 360/31 |
| 2010/0079908 A1 | 4/2010 | Heidmann | |
| 2018/0314862 A1 | 11/2018 | Traynor et al. | |

OTHER PUBLICATIONS

International Search Report and Written Opinion dated Mar. 18, 2020, Patent Application No. PCT/US2019/065534, filed Dec. 10, 2019, 14 pages.

Matesy, "Because sometimes perspective DOES matter! Realtime magneto-optical field viewing," Jan. 1, 2013, 13 pages.

Simpson, D. A., et al., "Magneto-Optical Imaging of Thin Magnetic Films Using Spins in Diamond," Scientific Reports 6(22797):1-12, Mar. 14, 2016.

* cited by examiner

MAGNETO OPTIC DISK IMAGER

CROSS-REFERENCE TO RELATED APPLICATION

This application claims priority to U.S. patent application Ser. No. 16/216,880, filed Dec. 11, 2018, entitled "MAGNETO OPTIC DISK IMAGER," the disclosure of which is incorporated herein by reference in its entirety.

BACKGROUND

Magnetic data storage can take a variety of forms including magnetic tapes, magnetic stripes, and magnetic disk drives. Data may be arranged physically on magnetic media in a wide variety of ways. For example, data may be recorded on linear tracks, in a spiral fashion around the central axis, in a bidirectional manner on magnetic tape, or on magnetic tape using a helical scan. In addition, data can be encoded at various bit rates and with various error correction properties. In general, a device that writes data to a magnetic data storage medium is capable of reading the data from the magnetic data storage medium. However, this is not always the case. For example, media may be recovered from a failed mechanism, or removable media may be discovered and a compatible device may not be available. Therefore, it is desirable to have a way to recover information from magnetic media that does not require access to the device with which the data was written.

BRIEF DESCRIPTION OF THE DRAWINGS

Various techniques will be described with reference to the drawings, in which.

DETAILED DESCRIPTION

Figure 1:
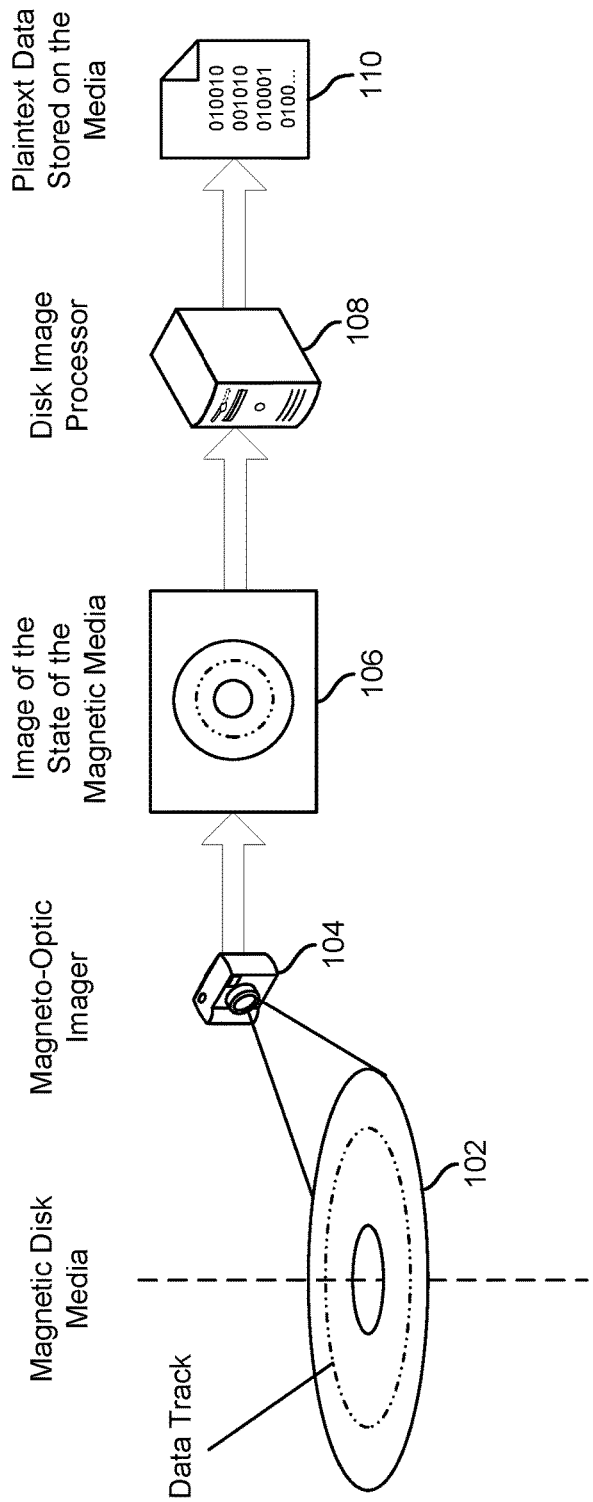
FIG. 1 illustrates an example of a system for recovering information stored on magnetic media using a magneto-optic imager, in accordance with an embodiment.

Techniques and systems described below relate to recovering information stored on magnetic media using magneto-optical imaging techniques. In one example, a piece of magnetic media such as a disk platter from a disk drive is placed on a turntable. The turntable may be rotated using a servo mechanism. A magneto-optic image sensor is mounted on a mechanism that allows the image sensor to be moved radially across the disk. In some examples, the sensor may be attached to a mechanism that allows the distance from the sensor to the surface of the disk to be adjusted. In another example, the sensor includes an adjustable focus so that the sensor can be adjusted to operate at a given height. By rotating the disk and moving the sensor radially across the disk, the system is able to capture a plurality of images that, when stitched together to form a single composite image, represent the magnetic state of the piece of magnetic media. In some examples, images can be captured by moving the sensor over the media with an XY traversing mechanism and maintaining the piece of magnetic media in a stationary position. In some embodiments, the sensor may be rotated in addition to elevated to improve the contrast of images obtained with the sensor. In various examples, the system is adapted to capture an image of the magnetic state of disk media, drum media, magnetic stripe media, or magnetic tape media.

Using the magneto-optic images of the state of the magnetic media, the system is able to determine the data stored on the media. For example, if the media is a piece of disk media, the system identifies servo information and sector formatting information on a disk drive. Using this information, the system identifies and extracts encoded data from individual sectors of the disk. The encoded data can be decoded in accordance with the encoding scheme used on the disk such as run length limited ("RLL") encoding, Manchester encoding, Return-to-zero ("RZ") encoding, Non-Return-to-zero ("NRZI") encoding, modified frequency modulation ("MFM") encoding, or modified modified frequency modulation ("M2FM"). In another example, if the media is a magnetic tape, the system can identify one or more tracks on the tape, and extract the encoded bitstream which can then be decoded into the datastream that is stored on the tape.

The decoded data can be interpreted in accordance with the specifications of a file system and file structure to produce a set of data files. The data files can then be stored on conventional media such as a modern disk drive, flash memory, optical storage, cloud storage, USB memory stick, or other device.

Techniques described and suggested in the present disclosure improve the field of computing, especially the field of data recovery, by allowing magnetic media to be read and decoded without needing to have a working original device. In addition, very old and delicate magnetic media need not be exposed to the risk of flying a magnetic pickup coil over the surface of the disk. In a number of experiments conducted by the inventor, older magnetic media has been shown to be very fragile, and even cleaning the magnetic media in preparation for loading into a compatible disk mechanism can remove media from the substrate, resulting in permanent data loss. By using a contactless magneto-optic imager, the magnetic state of the media can be captured without risking the destruction of the media. Techniques described and suggested in the present disclosure are necessarily rooted in computer technology in order to overcome problems specifically arising with legacy information storage technologies by providing a data recovery mechanism that safely determines the magnetic state of the media without relying on access to the original reading mechanism.

FIG. 1 illustrates an example of a system 100 for recovering information stored on magnetic media using a magneto-optic imager, in accordance with an embodiment. In an embodiment, a piece of magnetic data-storage media 102 contains data that is encoded in a magnetic state. In various examples, the piece of magnetic data-storage media may be a hard disk platter, a piece of floppy disk media, a magnetic stripe (such as those commonly found on credit cards), a magnetic data card, a piece of magnetic ink character recognition ("MICR") printed media, a magnetic tape, or a piece of magnetic drum media. Hard disk platters may be removable hard disk platters (single or double sided) that may be loaded into a reader device by a user, or fixed hard disk platters that have been removed from an associated mechanism. In the example shown in FIG. 1, the piece of magnetic data-storage media is a hard disk platter having data written circumferentially on concentric tracks.

In an embodiment, the system uses a magneto-optic imager 104 to capture an image that represents the magnetic state of the piece of magnetic data-storage media 102. In an example, the magneto-optic imager 104 is a two dimensional magneto-optical magnetic field sensor such as the MATSEY(TM) MagEye-8×8 mm-A. In some embodiments, the magneto-optic imager 104 uses the Faraday affect within the magneto-optical magnetic field sensor by detecting rotation of the polarization plane of linearly polarized light. A resulting magneto-optical image is recorded with a digital camera element. The magneto-optic imager 104 is connected to a disk image processor 108 via an interface such as a USB interface, and the disk image processor 108 processes the resulting image to reveal two-dimensional magnetic field information.

In some examples, the magneto-optic imager 104 is a high-resolution imager able to capture an image of the entire piece of magnetic media in a single capture operation. In another example, the magneto-optic imager 104 is moved over the surface of the piece of magnetic data-storage media 102 under the control of the disk image processor 108, and the magneto-optic imager 104 captures a plurality of images of the piece of magnetic data-storage media 102. The images are combined to form a composite image 106. In some examples, the intensity of each pixel in the composite image 106 provides an indication of the magnetic state of the magnetic media at a corresponding point. In some examples, the plurality of images include overlapping images and the combination is performed using image stitching algorithms to form a composite image of the entire piece of magnetic data-storage media 102. A variety of stitching algorithms may be used such as Autostitch, Hugin, Ptgui, Panorama Tools, and CleVR Stitcher.

In various embodiments, the disk image processor 108 may be a personal computer system, microcontroller, virtual machine, computing service, computer runtime, or embedded controller. The disk image processor 108 includes one or more processors and a memory containing executable instructions that, as a result of being executed by the one or more processors, cause the disk image processor 108 to perform operations such as obtaining the magneto-optic image from the magneto-optic imager 104 and processing the composite image 106 to produce plaintext data 110. In some examples, the disk image processor 108 controls one or more actuators that move the magneto-optic imager 104 over the surface of the magnetic media.

In many examples, additional data processing is performed to convert the composite image 106 into data that is usable by the end-user. In an embodiment, the system searches the image to locate servo information that encodes position data on the media. Using the servo information, the disk image processor 108 identifies tracks on the disk that contain data sectors. Each track may be scanned to identify sector headers that identify sector ordering for the drive media. In some examples, the disk image processor locates media defect tables that alter the sector mapping to account for imperfections in the media. The disk image processor 108 processes the composite image 106 to extract data for each sector, and links the data from each sector together into an addressable data set. In some examples, the data on the drive is encoded in accordance with a magnetic encoding scheme (such as RLL, etc., mentioned above), and the disk image processor 108 decodes the data to reveal the plaintext data 110. In some examples, the disk image processor 108 writes the data to a disk image file that is provided to the user. In other examples, the disk image processor 108 applies a file system schema to the data and provides a set of files to the end-user.

Examples of the system may be used to extract data from media for which a compatible drive is no longer available, or to recover data from media when an associated mechanism fails. Unlike the magnetic elements found in many disk drives, the magneto-optic imager 104 does not "fly" on an air cushion and therefore poses little risk of damage to old and frail magnetic media.

Figure 2:
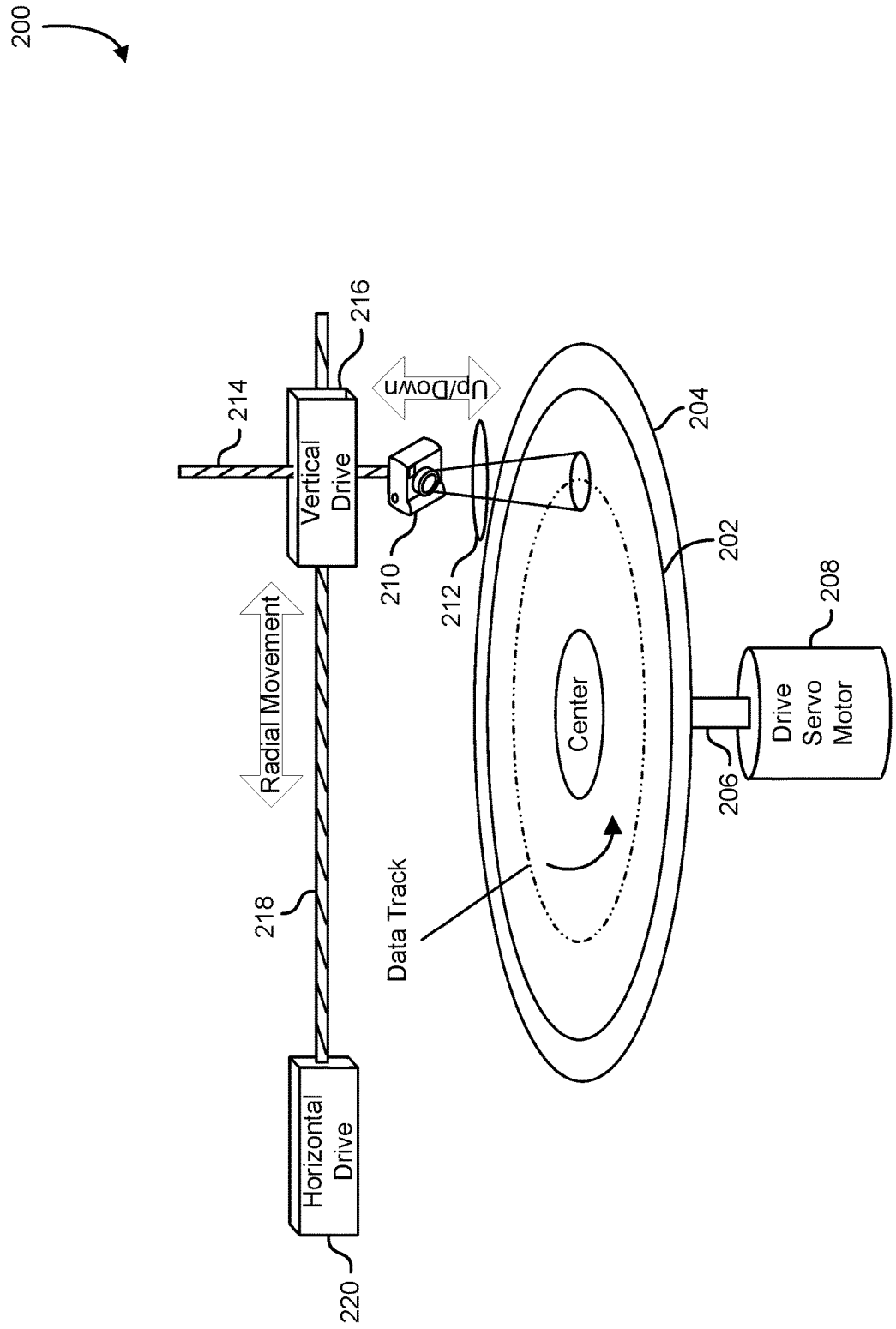
FIG. 2 illustrates an example of a turntable mechanism for collecting magneto-optic images of a magnetic disk, in accordance with an embodiment.

FIG. 2 illustrates an example of a turntable mechanism for collecting magneto-optic images of a magnetic disk, in accordance with an embodiment. A system 200 illustrates an example of a mechanism that can be used to obtain an image of a piece of magnetic media 202. The piece of magnetic media 202 may be a hard disk platter, floppy disk, or circular media that takes a magnetic state to store information. The piece of magnetic media 202 is retained on a turntable 204 that is coupled to a drive servo motor 208 via a driveshaft 206. In various examples, the drive servo motor 208 may be coupled to the turntable using a belt drive, pulley, or gear mechanism. In an example, the drive servo motor 208 includes a position encoder that provides angular position information to a controller. The controller is a computer system that includes I/O circuitry and drivers capable of controlling the mechanism. In some embodiments, the drive servo motor 208 is a stepper motor.

In an embodiment, the system 200 includes a magneto-optic image sensor 210. The magneto-optic image sensor 210 captures an image of the piece of magnetic media 202 that represents the magnetic state on the piece of magnetic media 202. An image that represents the magnetic state of the piece of magnetic media may be referred to as a magneto-optic image. In some examples, the system includes a focus element 212. The focus element 212 is a lens that may be integrated with the magneto-optic image sensor 210 or, in some examples, separate from the magneto-optic image sensor 210. In some examples, the focus element 212 is electrically controllable via a controller. The focus element 212 improves the contrast of images acquired by the magneto-optic image sensor 210 by allowing the focal distance to be adjusted. In some examples, the magneto-optic image sensor includes a CCD element that acquires a set of pixels, and circuitry inside the sensor converts the pixels into image data that is then provided. In some implementations, the system provides the ability to alter the distance between the magneto-optic image sensor 210 and the surface of the piece of magnetic media 202. In some examples, the ability is provided using a linear actuator comprising a vertical drive shaft 214 and vertical drive motor 216. In some examples, the ability is provided using a linear servo that provides vertical position information to the controller. The system 200 includes the ability to move the magneto-optic image sensor 210 across the radius of the piece of magnetic media 202. Various examples may move the sensor in line with a radius, or in a direction that is substantially in line with a radius such that the sensor is able to cover the data area of the disk when rotated on the turntable 204. In some examples, radial movement is accomplished using a linear actuator or linear servo having a horizontal driveshaft 218 and horizontal drive motor 220.

The controller is able to control the vertical drive motor 216, the horizontal drive motor 220, and the drive servo motor 208 to position the magneto-optic image sensor 210 over different portions of the piece of magnetic media 202. The controller collects images provided by the magneto-optic image sensor 210 that, when combined, provide a composite image of the magnetic state of the piece of magnetic media 202. In some implementations, the controller uses the focus element 212 and/or the vertical positioning mechanism to adjust the contrast of the acquired images (autofocus). In some examples, the mechanism includes the ability to rotate the magneto-optic image sensor 210 to improve the contrast of the acquired images. In another example, the mechanism includes the ability to rotate a polarizing filter between the magneto-optic image sensor 210 in the piece of magnetic media 202 to adjust the contrast of the acquired images. Using a mechanism similar to that shown in FIG. 2, the controller may use a number of different imaging sequences to acquire the composite image of the piece of magnetic media 202.

Figure 3:
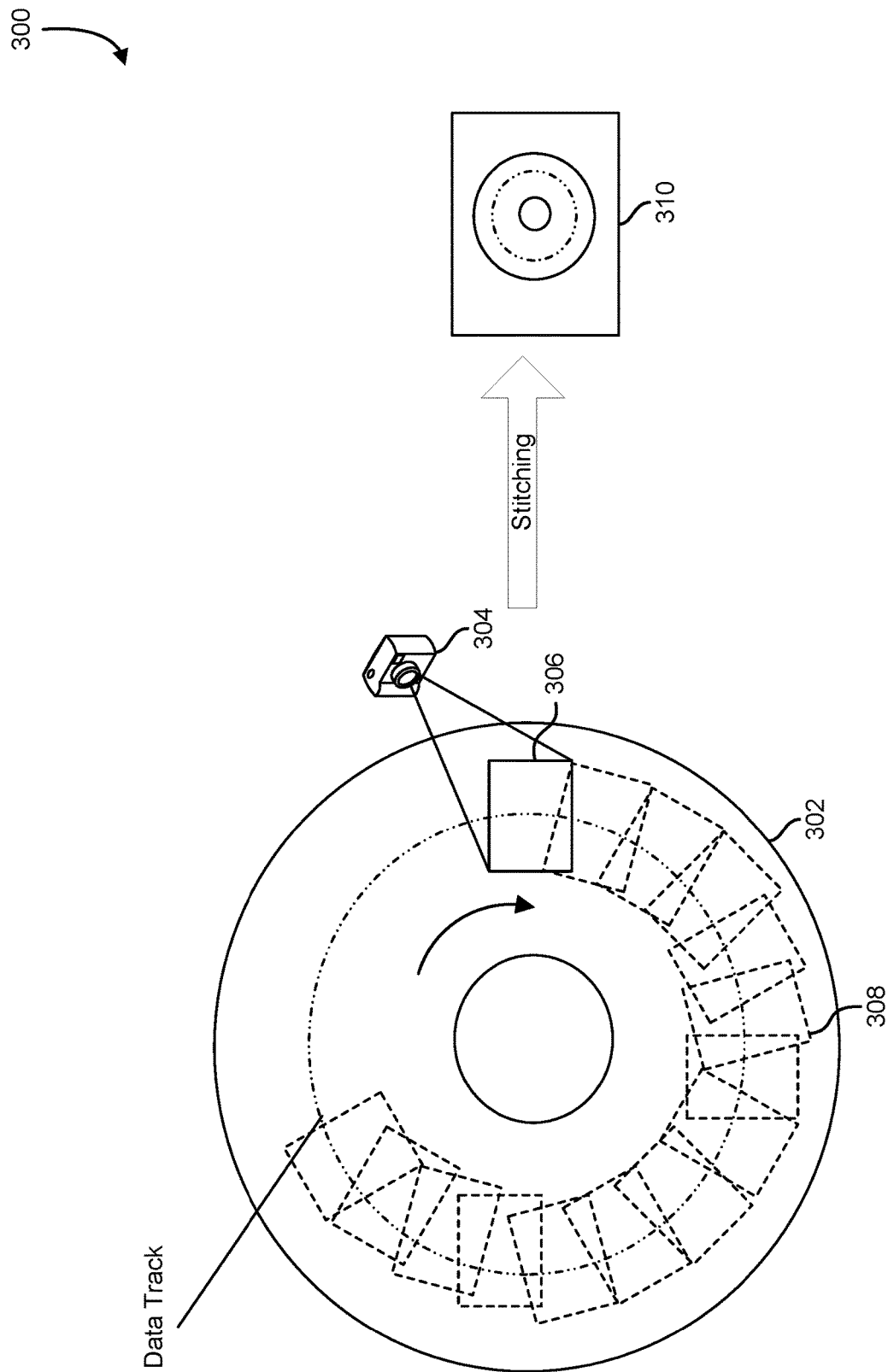
FIG. 3 illustrates an example of a circumferential imaging sequence performed with a turntable mechanism, in accordance with an embodiment.

FIG. 3 illustrates an example of a circumferential imaging sequence performed with a turntable mechanism, in accordance with an embodiment. A diagram 300 illustrates an imaging sequence that can be used to acquire a composite image 310 of a piece of magnetic media 302. A controller positions a magneto-optic image sensor 304 at a radius that allows an image 306 of a portion of the data track to be captured. After capturing an image, the controller rotates the piece of magnetic media 302 through an angle, and captures subsequent images such that each subsequent image partially overlaps a previous image. In some embodiments, the images may be collected in an interleaved sequence such that each image does not overlap a previous image but overlaps one or more other images earlier or later in the sequence. A resulting image sequence 308 can be stitched together to generate a substantially circular composite image that covers the data track. Additional image sequences are captured by moving the magneto-optic image sensor radially and rotating the piece of magnetic media 302 through a full rotation. A plurality of substantially circular image sequences are stitched together to form a composite image 310 of the piece of magnetic media 302.

Figure 4:
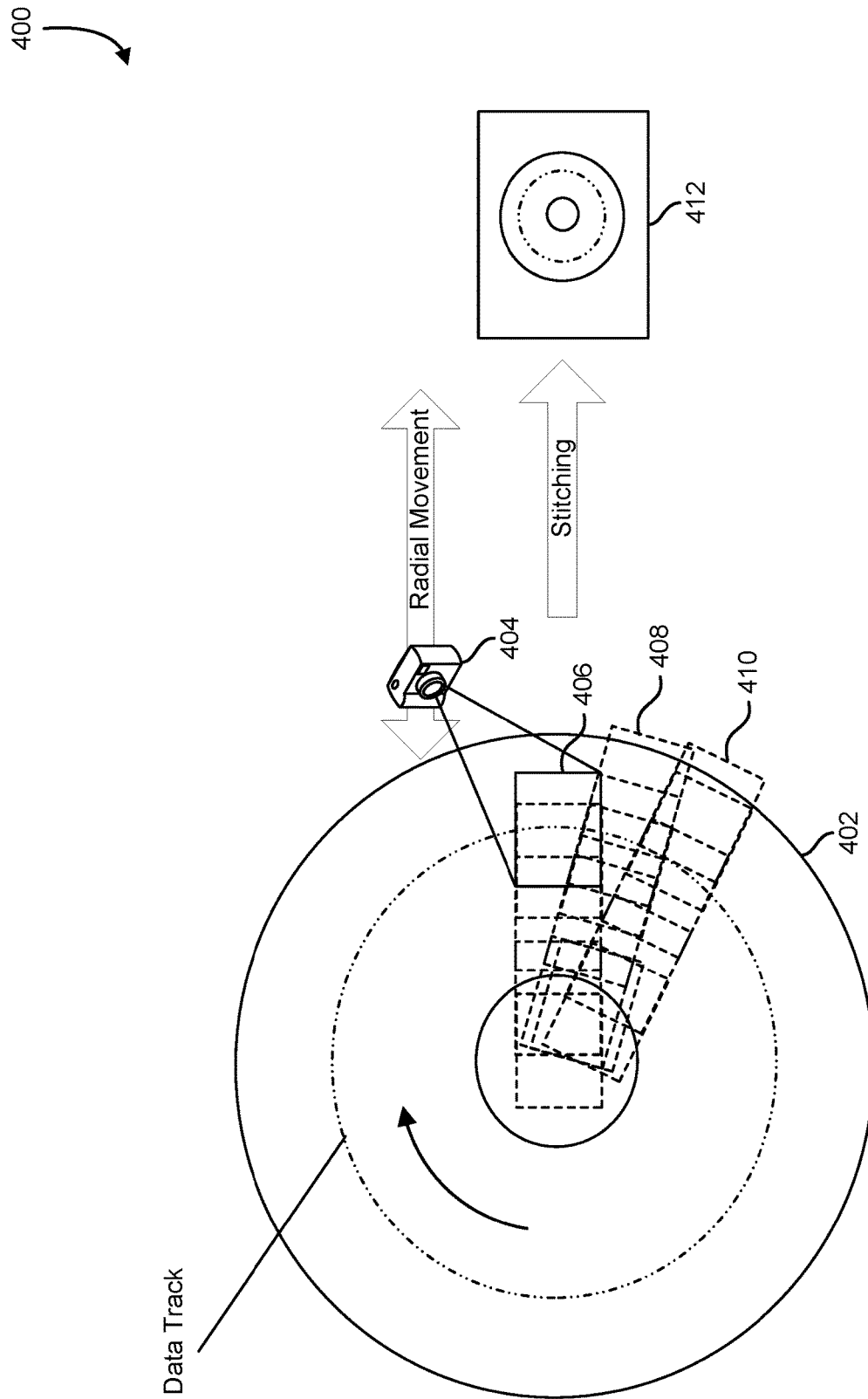
FIG. 4 illustrates an example of a radial imaging sequence performed with a turntable mechanism, in accordance with an embodiment.

FIG. 4 illustrates an example of a radial imaging sequence performed with a turntable mechanism, in accordance with an embodiment. A diagram 400 illustrates an imaging sequence that can be used to acquire the composite image 412 of a piece of magnetic media 402. A controller positions the piece of magnetic media 402 at a set angular position and moves a magneto-optic image sensor 404 substantially radially across the surface of the piece of magnetic media 402. The controller acquires a sequence of images of the disk surface 406 as the sensor is moved radially, and the sequence of images is stitched together to form an image stripe. The controller advances the angular position of the piece of magnetic media 402 and acquires subsequent image sequences 408, 410 that are combined to form subsequent image stripes. The image stripes are stitched together, ultimately forming a composite image 412 of the piece of magnetic media 402.

Figure 5:
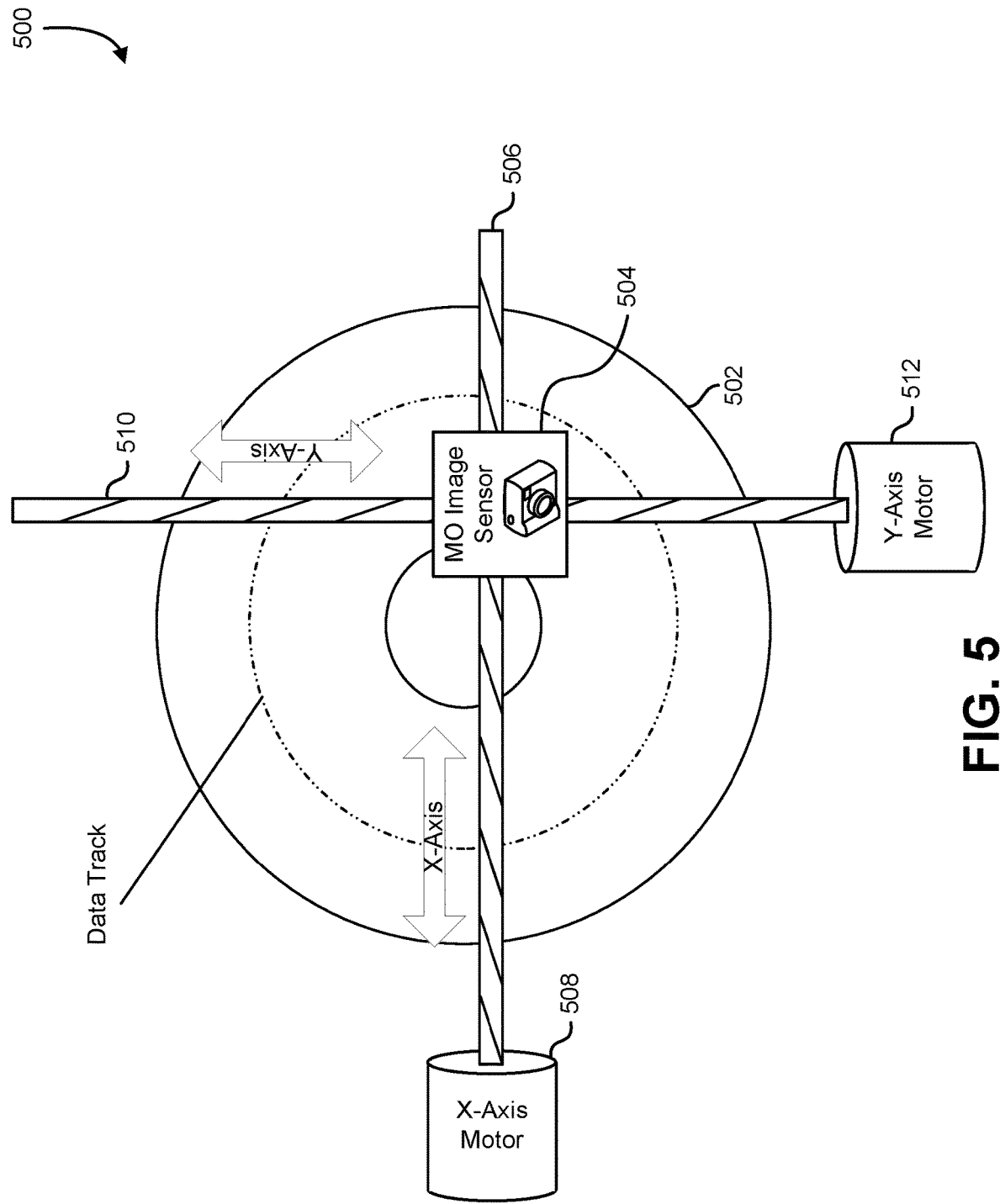
FIG. 5 illustrates an example of an XY linear positioning mechanism for collecting magneto-optic images of a magnetic disk, in accordance with an embodiment.

FIG. 5 illustrates an example of an XY linear positioning mechanism 500 that collects magneto-optic images of a magnetic disk, in accordance with an embodiment. In an embodiment, a piece of magnetic media 502 is retained beneath a magneto-optical image sensor 504 coupled to an XY traversing mechanism. The XY traversing mechanism includes an X-axis driveshaft 506 coupled to an X-axis motor 508, and a Y-axis driveshaft 510 coupled to a Y-axis motor 512. In some examples, the XY traversing mechanism includes a servo sensor that provides positional information to a controller that controls the mechanism. In some examples, the magneto-optic image sensor 504 is coupled to a Z-axis driveshaft and motor that allows the distance between the piece of magnetic media 502 and the magneto-optic image sensor 504 to be adjusted. In another example, the magneto-optic image sensor 504 is coupled to a rotating mechanism that allows the sensor to be rotated about the z-axis. In yet another example, the magneto-optic image sensor 504 includes a focusing element that allows the focal distance of the sensor to be adjusted.

In various examples, the piece of magnetic media 502 may be a piece of hard disk media, floppy disk media, a magnetic stripe, or a section of magnetic tape. In some implementations, the XY traversing mechanism may be implemented using a movable table on which the piece of magnetic media 502 is mounted, where the movable table can be moved on a first axis, and the magneto-optical image sensor 504 is mounted to a linear actuator or linear servo that moves the sensor along a second access orthogonal to the first axis.

In various examples, the mechanism shown in FIG. 5 is controlled by a controller that includes one or more processors and a memory containing executable instructions that, as a result of being executed by the one or more processors, cause the controller to operate the various components shown. In an example, the controller includes power circuitry and I/O interfaces that allow it to operate the X-axis motor 508 and the Y-axis motor 512 in such a way as to move the magneto-optic image sensor 504 over the surface of the piece of magnetic media 502, and collect a set of images from the magneto-optic image sensor 504 that, when combined together, form a composite image representing the magnetic state of the piece of magnetic media 502.

Figure 6:
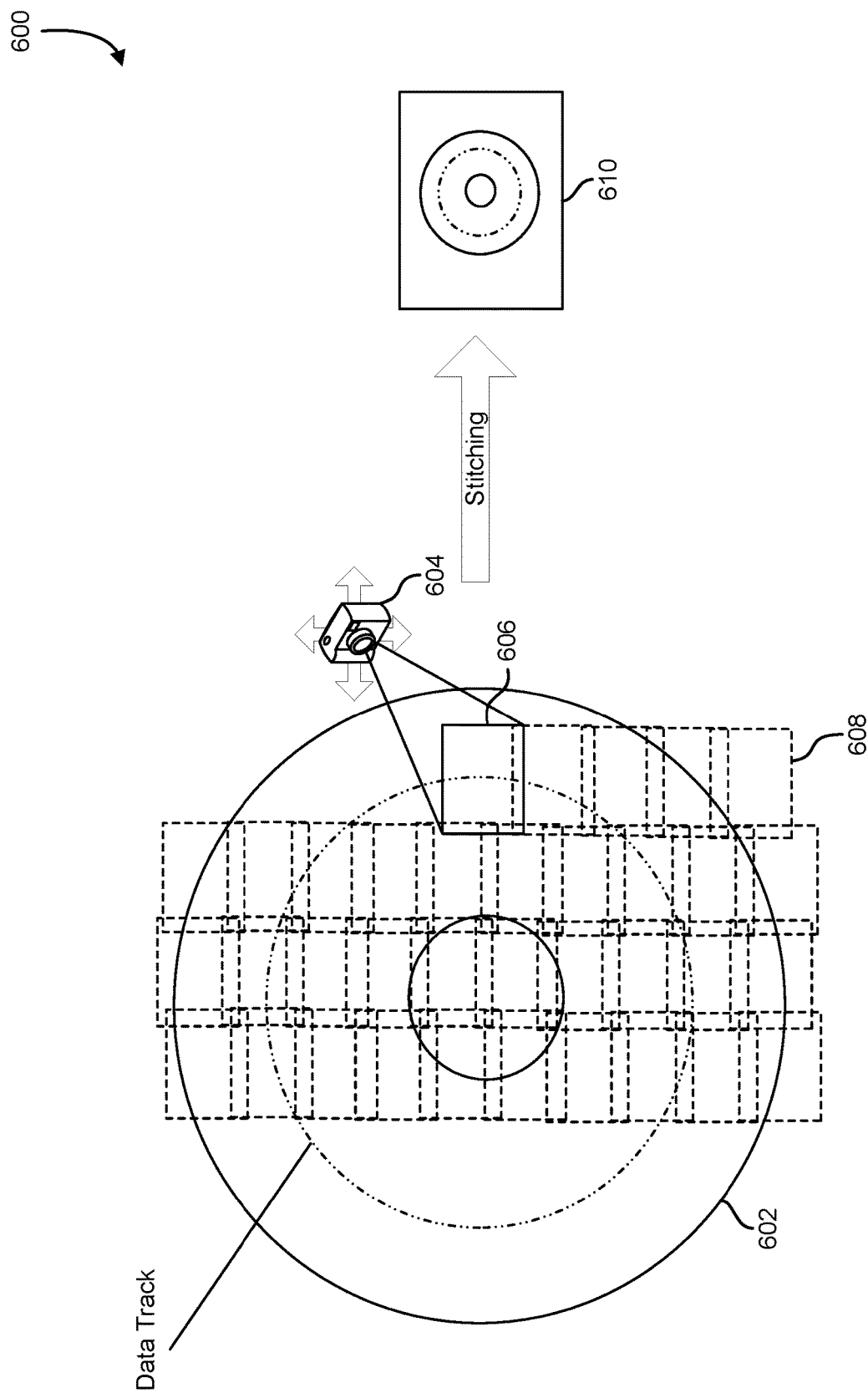
FIG. 6 illustrates an example of a linear imaging sequence performed using an XY linear positioning mechanism, in accordance with an embodiment.

FIG. 6 illustrates an example of a linear imaging sequence 600 that can be performed using an XY linear positioning mechanism, in accordance with an embodiment. In an embodiment, a magneto-optic imaging sensor 604 is moved over the surface of a piece of magnetic media 602 using an XY positioning systems such as the positioning mechanism illustrated in FIG. 5. In an example, the magneto-optic imaging sensor 604 is positioned along a first axis and moved along a second access orthogonal to the first axis. As the magneto-optic imaging sensor 604 is moved across the piece of magnetic media 602, a controller causes the magneto-optic imaging sensor 604 to acquire an image 606 that represents the magnetic state of a portion of the piece of magnetic media 602. As each image is acquired, the controller advances the magneto-optic imaging sensor 604 along the second axis and obtains a sequence of overlapping subsequent images 608. The sequence of overlapping images is combined into an image stripe, and the controller moves the magneto-optic imaging sensor 604 along the first axis to acquire additional sets of images which can be combined into additional overlapping image stripes. The overlapping image stripes are combined to form a composite image 610 that represents the magnetic state of the piece of magnetic media 602. In some examples, the magneto-optic imaging sensor 604 is connected to a rotation mechanism that allows the sensor to be positioned in a way that maximizes the contrast communicated by different magnetic states on the media.

Figure 7:
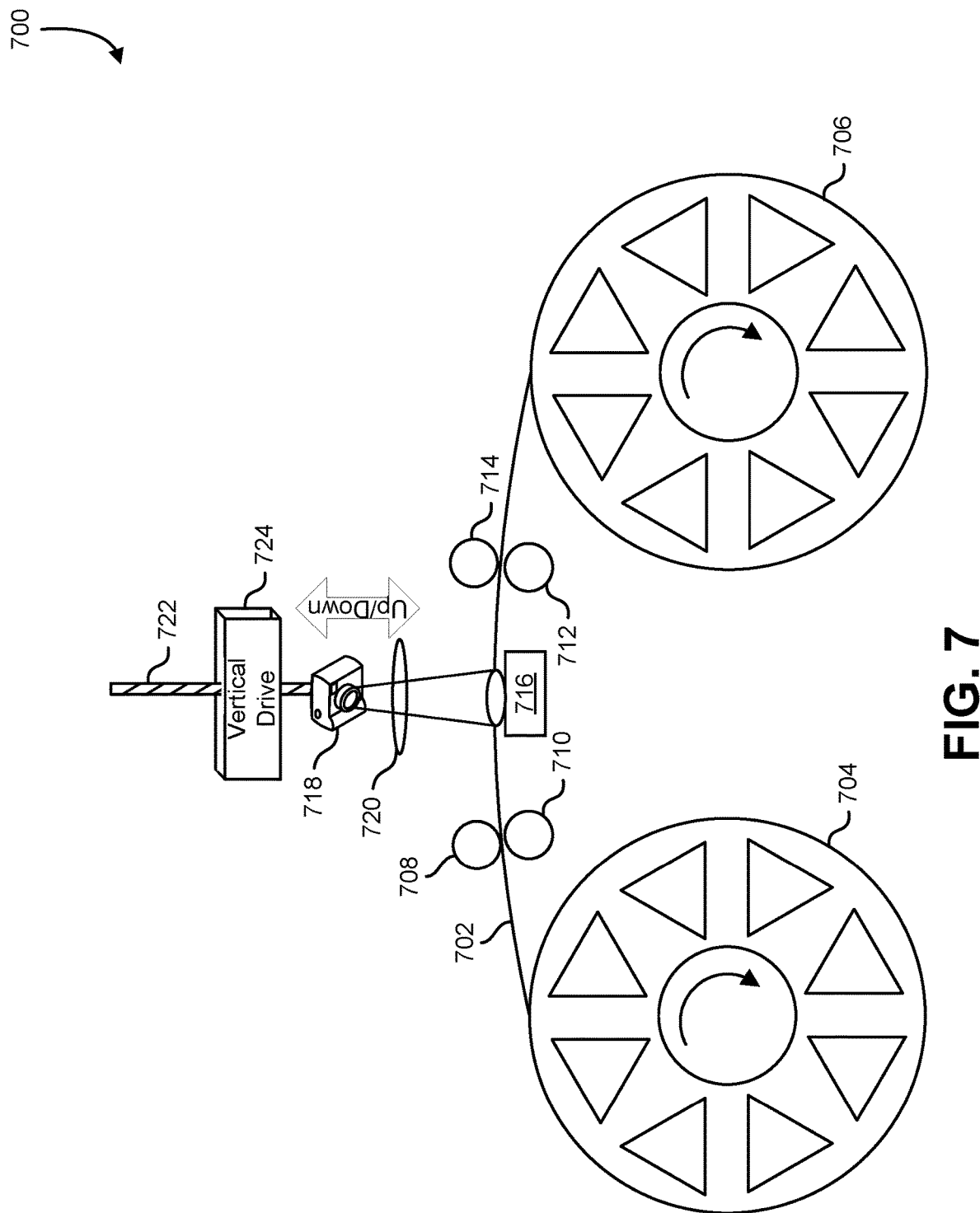
FIG. 7 illustrates an example of a mechanism for collecting magneto-optic images of magnetic tape, in accordance with an embodiment.

FIG. 7 illustrates an example of a mechanism 700 that collects magneto-optic images of a magnetic tape 702, in accordance with an embodiment. The magnetic tape 702 is fed from a source reel 704 to a pickup reel 706 which may be driven with motors controlled by a controller. In an embodiment, the tape is guided by a number of rollers 708, 710, 712, 714, and an imaging surface 716. A magneto-optic image sensor 718 is positioned above the imaging surface 716 so that images of the magnetic tape 702 may be acquired. In some examples, a focus element 720 allows the contrast of the acquired images to be tested. In another example, the magneto-optic image sensor 718 is coupled to a linear actuator that includes a vertical driveshaft 722 and a vertical drive motor 724. The vertical drive motor 724 may be controlled by the controller so that the magneto-optic image sensor 718 can be positioned at various distances from the magnetic tape 702.

In an embodiment, a magnetic tape is loaded onto the source reel 704, fed through the rollers and across the imaging surface 716, and wound onto the pickup reel 706. The controller draws the tape across the imaging surface 716 using a motor connected to the pickup reel 706. As the magnetic tape is drawn across the imaging surface 716, the controller causes the magneto-optic image sensor 718 to acquire a sequence of images that represent the magnetic state of portions of the magnetic tape 702. The sequence of images may be combined using a stitching algorithm or other method to form a composite image that represents the magnetic state of the magnetic tape 702.

Figure 8:
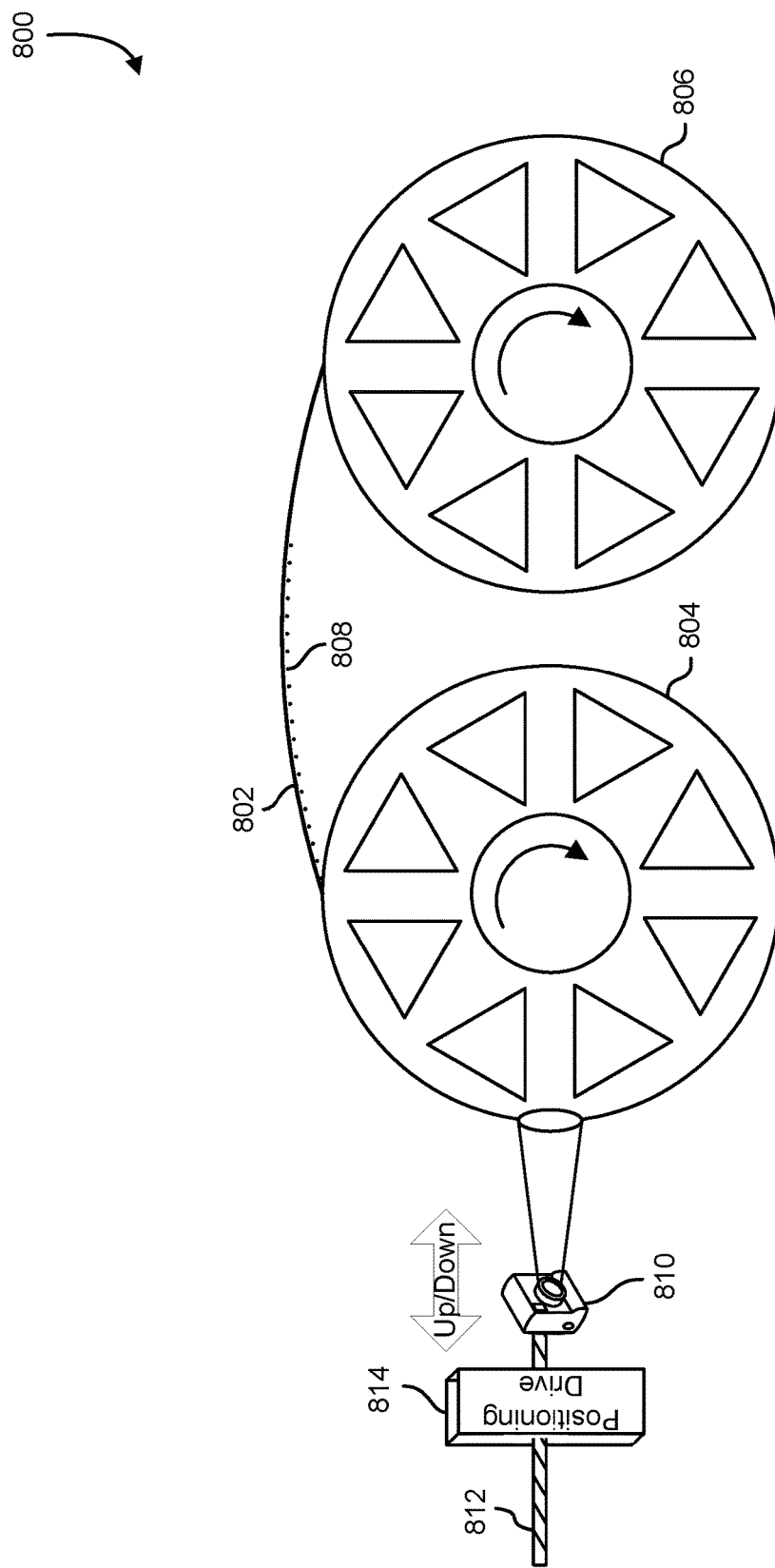
FIG. 8 illustrates an example of a mechanism for collecting data from a magnetic tape, in accordance with an embodiment.

FIG. 8 illustrates an example of a mechanism 800 for collecting data from a magnetic tape 802, in accordance with an embodiment. The magnetic tape 802 is fed from a source reel 804 to a pickup reel 806 which may be driven with motors controlled by a controller. As the magnetic tape 802 is unwound from the source reel 804, there may be adhesion between the portion of the tape that is unwound and the portion that remains wound on the source reel 804. As a result, it is possible that portions of magnetic media may be transferred from the unwound portion and the remaining portion of the magnetic tape 802. Media fragments 808 may be found where the tape separates from the reel. This may result in data loss once the tape is unwound from the source reel 804.

In an embodiment, this data loss can be avoided by reading the information from the magnetic tape before the tape is unspoiled from the source reel. In one example, a magneto-optic image sensor 810 is positioned to read the magnetic tape 802 prior to the magnetic tape being unspoiled from the source reel 804. The magneto-optic image sensor 810 may be coupled to a driveshaft 812 and a positioning drive 814 to allow the distance between the sensor and the magnetic tape 802 to be adjusted. In another example, a magnetic pickup may be positioned over the magnetic tape prior to the tape being unwound from the source reel 804.

In some examples, magnetic fragments may be transferred to the outer surface of the remaining tape on the source reel 804. If this occurs, a cleaning element may be positioned before the magneto-optic image sensor 810 to remove the fragments before the magnetic tape 802 is scanned. In one embodiment, the data acquired via the magneto-optic image sensor 810 is processed and validated before the tape is unwound from the source reel 804. For example, in the example shown in FIG. 8, the positioning of the magneto-optic image sensor 810 allows the unwinding of the magnetic tape 802 to be delayed by one quarter of a turn from the point the magnetic tape 802 is read. If an error is detected in the data, the unwinding of the magnetic tape 802 can be stopped. The unwinding of the magnetic tape 802 can be reversed so that the portion with the error can be reread without unscrewing the portion. In this way, the data can be recovered before risking permanent damage to the tape caused by unwinding.

The above process may be particularly useful in cases where magnetic tapes have been improperly stored, or where magnetic tapes are very old allowing adhesion between layers of the magnetic tape to occur. By recovering the data before unwinding, the data can be recovered and validated before any media has a chance to separate from the tape.

Figure 9:
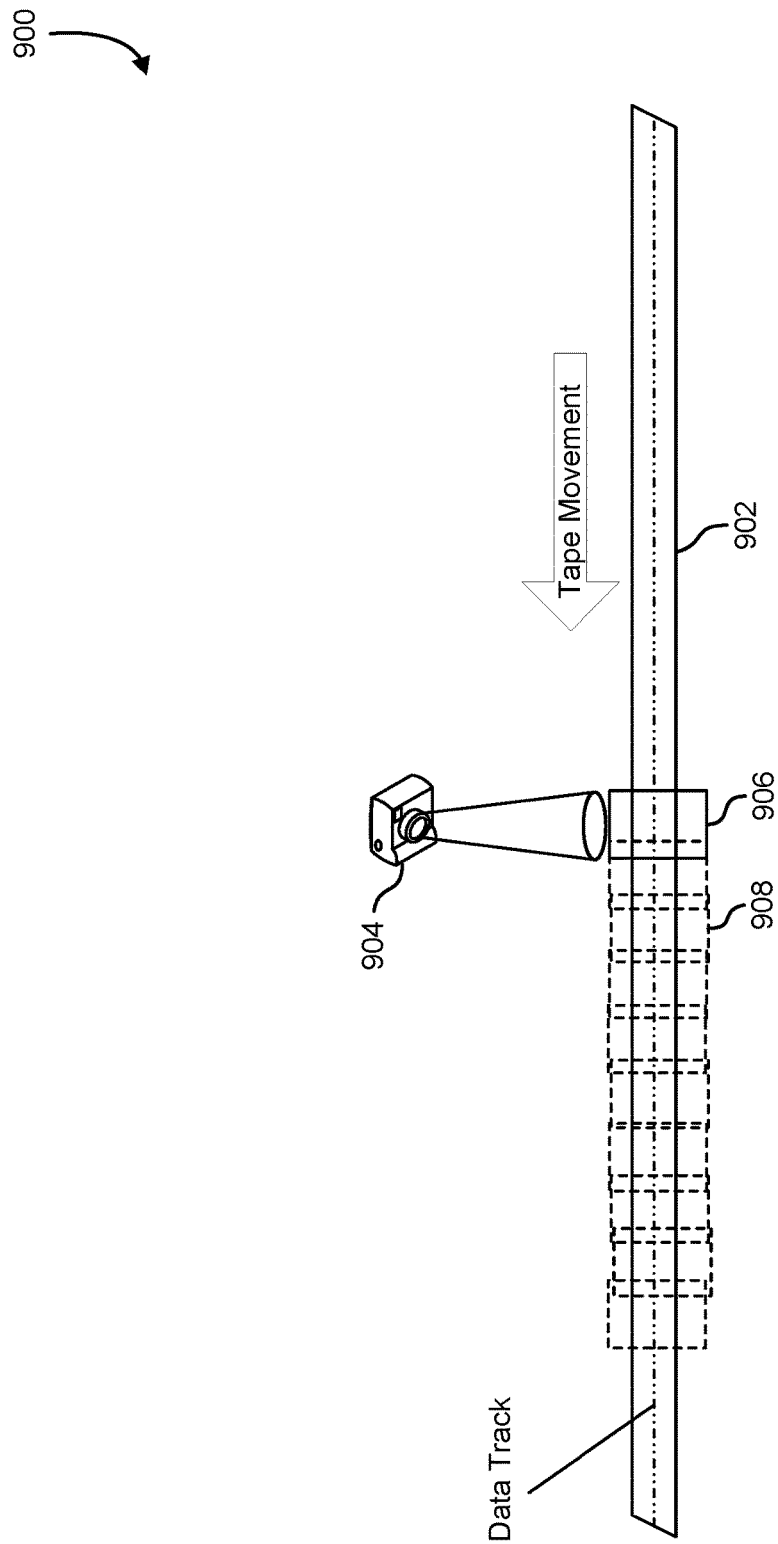
FIG. 9 illustrates an example of an imaging sequence for capturing data on a magnetic tape, in accordance with an embodiment.

FIG. 9 illustrates an example of an imaging sequence 900 for capturing data on a magnetic tape 902, in accordance with an embodiment. Using a mechanism such as the mechanism illustrated in FIG. 7 or 8, a controller moves the magnetic tape 902 across the field of view of a magneto-optic image sensor 904. The controller causes the magneto-optic image sensor 904 to capture an image 906 of a portion of the magnetic tape. The controller requires additional images as the magnetic tape 902 is moved across the field of view to form an image sequence 908. In an embodiment, the image sequence is provided to a computer system (or in some examples, the controller itself) which combines the image sequence 908 into a composite image that represents the magnetic state of the magnetic tape 902.

Figure 10:
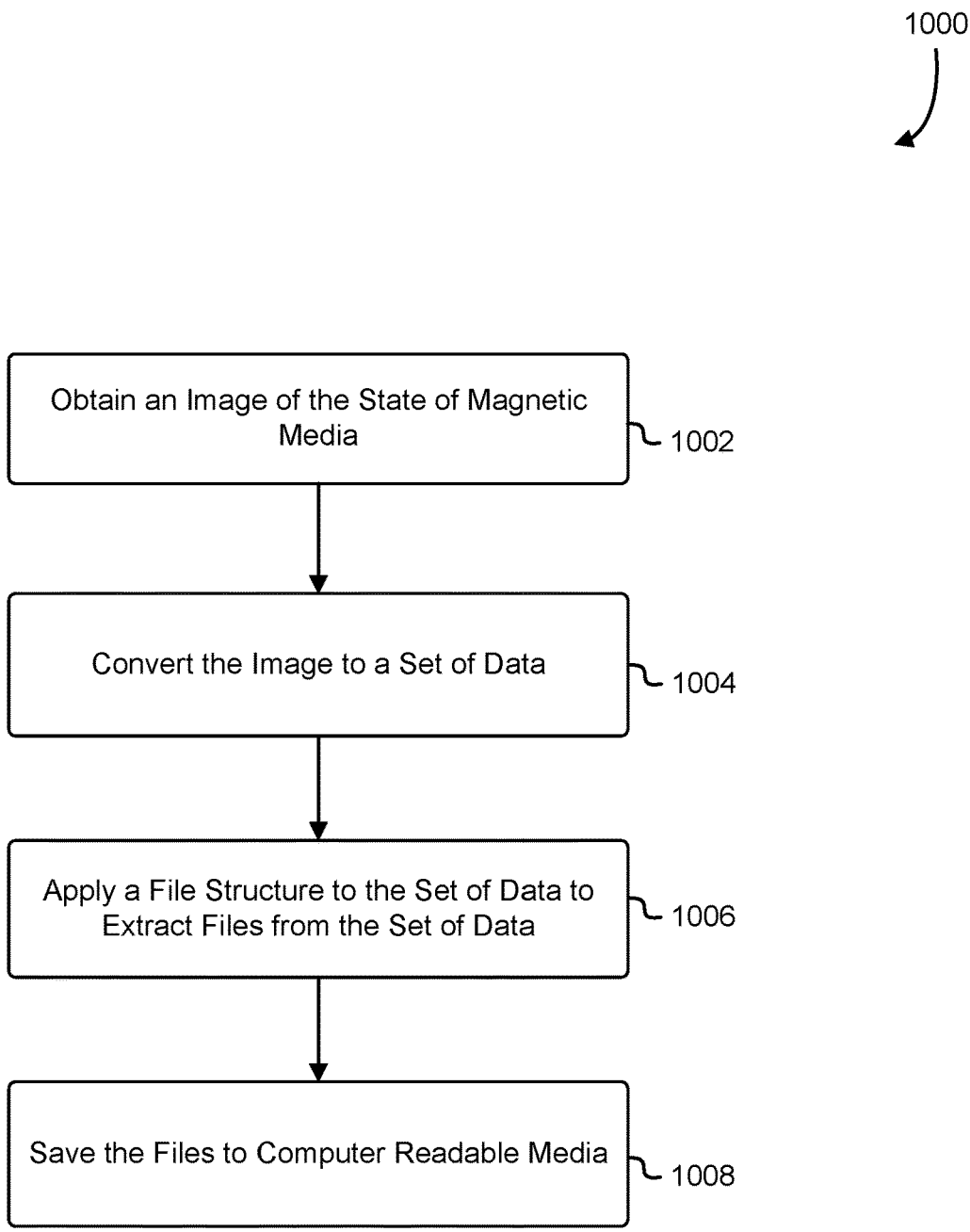
FIG. 10 is a flowchart that illustrates an example of a process that, as a result of being performed by a computer system, recovers data from magnetic media using magneto-optic imaging, in accordance with an embodiment.

FIG. 10 is a flowchart that illustrates an example of a process 1000 that, as a result of being performed by a computer system, recovers data from magnetic media using magneto-optic imaging, in accordance with an embodiment. Some or all of the process 1000 (or any other processes described, or variations and/or combinations of those processes) may be performed under the control of one or more computer systems configured with executable instructions and/or other data, and may be implemented as executable instructions executing collectively on one or more processors. The executable instructions and/or other data may be stored on a non-transitory computer-readable storage medium (e.g., a computer program persistently stored on magnetic, optical, or flash media).

Figure 14:
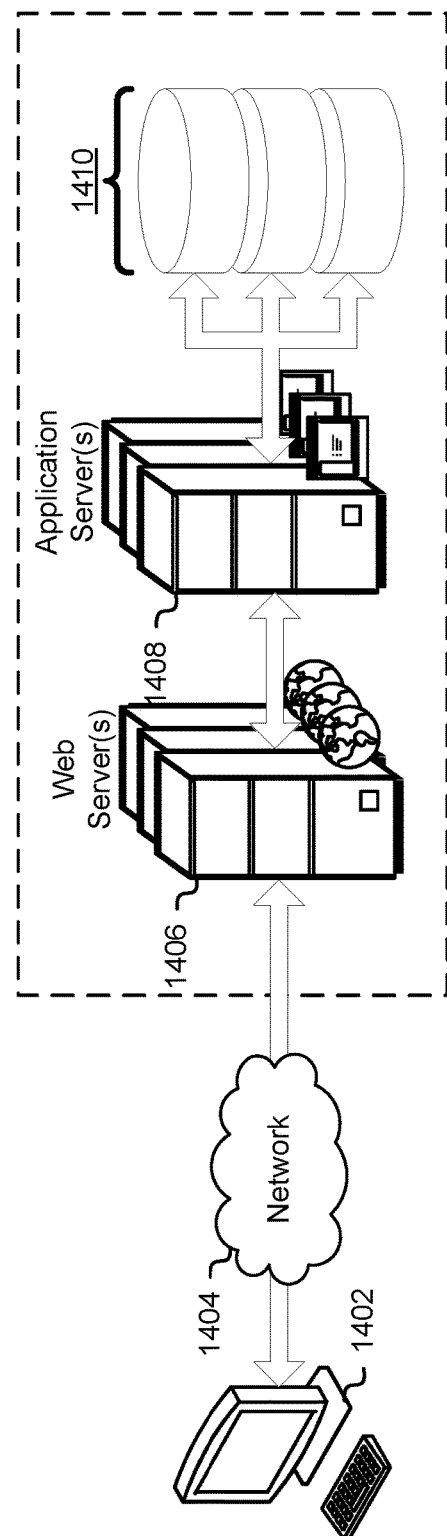
FIG. 14 illustrates an environment in which various embodiments can be implemented.

For example, some or all of process 1000 may be performed by any suitable system, such as a server in a data center, by various components of the environment 1400 described in conjunction with FIG. 14, such as the one or more web servers 1406 or the one or more application servers 1408, by multiple computing devices in a distributed system of a computing resource service provider, by a controller associated with one of the mechanisms described above, or by any electronic client device such as the electronic client device 1402. The process 1000 includes a series of operations wherein data stored on a piece of magnetic media is recovered using magneto-optic imaging.

At block 1002, the system obtains an image that represents the magnetic state of a piece of magnetic media. In some examples, the images are acquired using a magneto-optic image sensor. The piece of magnetic media may be a magnetic disk, a magnetic tape, magnetic stripe, a floppy disk, a magnetic drum, or magnetized surface. In some examples, block 1002 may include operations described above with respect to the various embodiments described above. For example, operations performed at block 1002 may include rotating a piece of magnetic media on a turntable and moving the magneto-optic sensor across the radius of the turntable to acquire a sequence of images that are combined to form a composite image of the entire piece of media. The composite image may be a single image captured in one capture operation from the magneto-optic sensor, or an image assembled from a plurality of overlapping images.

At block 1004, the system analyzes the image to obtain a set of data stored on the magnetic media. The particular operations performed to extract the set of data are generally based at least in part on the way the data is arranged on the media. In one example, the magnetic media is a magnetic tape, and the system identifies a set of linear tracks that run lengthwise along the length of the tape. In another example, the magnetic media is a hard disk platter, and the system identifies a set of concentric tracks on the disk. Tracks may be identified in a variety of ways. In some examples, the system identifies servo encoding information located on the media to identify data tracks. In an embodiment, the system analyzes the image along the data track to identify a data rate with which information has been written to the magnetic media. In some examples, the data rate may vary from one track to another, such as with a zoned disk drive. If the magnetic media includes header information (sector headers for disk media, or block headers for tape media), the header information is extracted and recorded in association with the data. In various examples, header information may indicate how data from different sectors and tracks may be linked together. In some examples, the magnetic media includes defect and sparing information that alters the sector mapping of the magnetic media to account for defects. Using the track and bit rate information, the system extracts the data from the image sector by sector and/or track by track, which is usually in an encoded form. The encoded data is then decoded into a block data, and the block data is arranged in accordance with the sector and sparing information. Various steps of this process may be modified or omitted based on the type of media being analyzed. Additional detail for these operations is described below and shown in FIG. 11.

At block 1006, in some embodiments, the system applies a file structure to the set of data extracted from the image. In some examples, the file structure is identified by prompting the user to identify the structure. In other examples, the file structure is inferred from the content of the set of data. For example, a file structure may be inferred by examining the master boot record and partition table information within the set of data. Once the file structure is identified, the set of data can be reinterpreted in accordance with the rules of the file structure to produce directory information, file attribute information, and file content.

At block 1008, the system can provide the files in a number of different ways. In some examples, the system writes the files to another form of computer-readable media such as a modern disk drive, flash drive, computer-readable memory, an optical storage drive, a data storage service, or a USB memory stick. In another example, the system provides an image file that can be used to write a piece of removable media or generate a virtual disk that is equivalent to the piece of magnetic media analyzed by the system. In some embodiments, the system converts the file information obtained at block 1006 to another file system format. For example, the system may extract obsolete mainframe-formatted files and convert them into Windows-compatible file system files.

In some embodiments, the system may combine information extracted from multiple media images to form a single volume. For example, a disk pack may include one or more media surfaces (such as three discs having six data surfaces), and the system may extract data from all six surfaces which is then combined and output as a single volume.

Note that one or more of the operations performed in 1000 may be performed in various orders and combinations, including in parallel.

Figure 11:
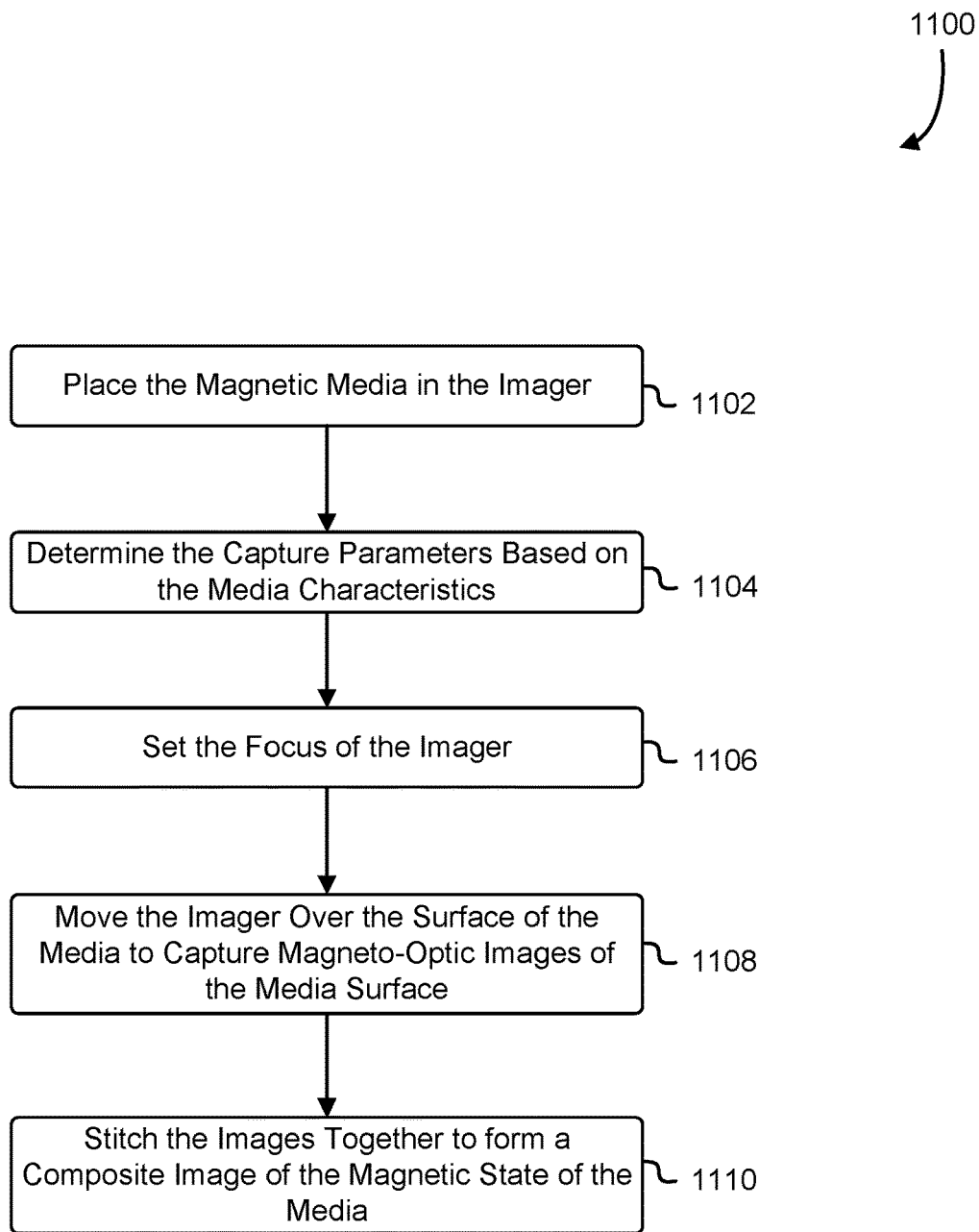
FIG. 11 is a flowchart that illustrates an example of a process that, as a result of being performed by computer system, acquires an image of the magnetic state of a portion of magnetic media, in accordance with an embodiment.

FIG. 11 is a flowchart that illustrates an example of a process 1100 that, as a result of being performed by computer system, acquires an image of the magnetic state of a piece of magnetic media, in accordance with an embodiment. Some or all of the process 1100 (or any other processes described, or variations and/or combinations of those processes) may be performed under the control of one or more computer systems configured with executable instructions and/or other data, and may be implemented as executable instructions executing collectively on one or more processors. The executable instructions and/or other data may be stored on a non-transitory computer-readable storage medium (e.g., a computer program persistently stored on magnetic, optical, or flash media).

For example, some or all of process 1100 may be performed by any suitable system, such as a server in a data center, by various components of the environment 1400 described in conjunction with FIG. 14, such as the one or more web servers 1406 or the one or more application servers 1408, by multiple computing devices in a distributed system of a computing resource service provider, or by any electronic client device such as the electronic client device 1402.

In an embodiment, at block 1102, a piece of magnetic media is loaded into an imaging mechanism such as the imaging mechanisms described above. The piece of magnetic media may be a magnetic disk, a magnetic drum, or magnetic tape. At block 1104, the system determines a set of capture parameters based on the characteristics of the magnetic media. In some examples, the capture parameters are determined by displaying a prompt to the user, and the user enters the parameters into the system. In other examples, the system captures one or more images of a portion of the magnetic media and by analyzing the images determines the capture parameters. Capture parameters may include the radius of disk media, the length and width of a magnetic tape, and a desired image resolution. In an embodiment, at block 1106, the system sets the focus of the imaging mechanism. In some examples, the focus of the imaging mechanism is adjusted by adjusting the distance between a magneto-optic image sensor and the surface of the magnetic media. In other examples, the focus of the imaging mechanism is adjusted by adjusting a focusing element (such as a lens) between the magneto-optic image sensor and the surface of the magnetic media.

At block 1108, the system moves the image sensor over the surface of the media to capture a plurality of magneto-optic images of the media surface. In various examples, the image sensor may be moved in accordance with any of the imaging sequences described above. In some examples, the system causes the image sensor to capture a sequence of overlapping images that is capable of being combined to form a composite image that represents the magnetic state of the entire piece of magnetic media.

At block 1110, the system combines the acquired images to form a composite image that represents the magnetic state of the piece of magnetic media. In some implementations, the acquired images are combined using a stitching algorithm. The stitching algorithm may be performed by the computer system, by another computing service, or using a separate computer system dedicated for that purpose. In some embodiments, the system provides hints to the stitching algorithm to aid in assembly of the composite image. The hints may include information that describes the surface being reconstructed (such as a disk, a drum, or a tape). In some examples, the hints include approximate position and orientation information for each image in the set of images to be combined. For example, in an embodiment, the mechanism provides position information associated with the image sensor as each image is collected, and the position information is provided to the stitching algorithm to assist in assembly of the final composite image.

Note that one or more of the operations performed in 1100 may be performed in various orders and combinations, including in parallel.

Figure 12:
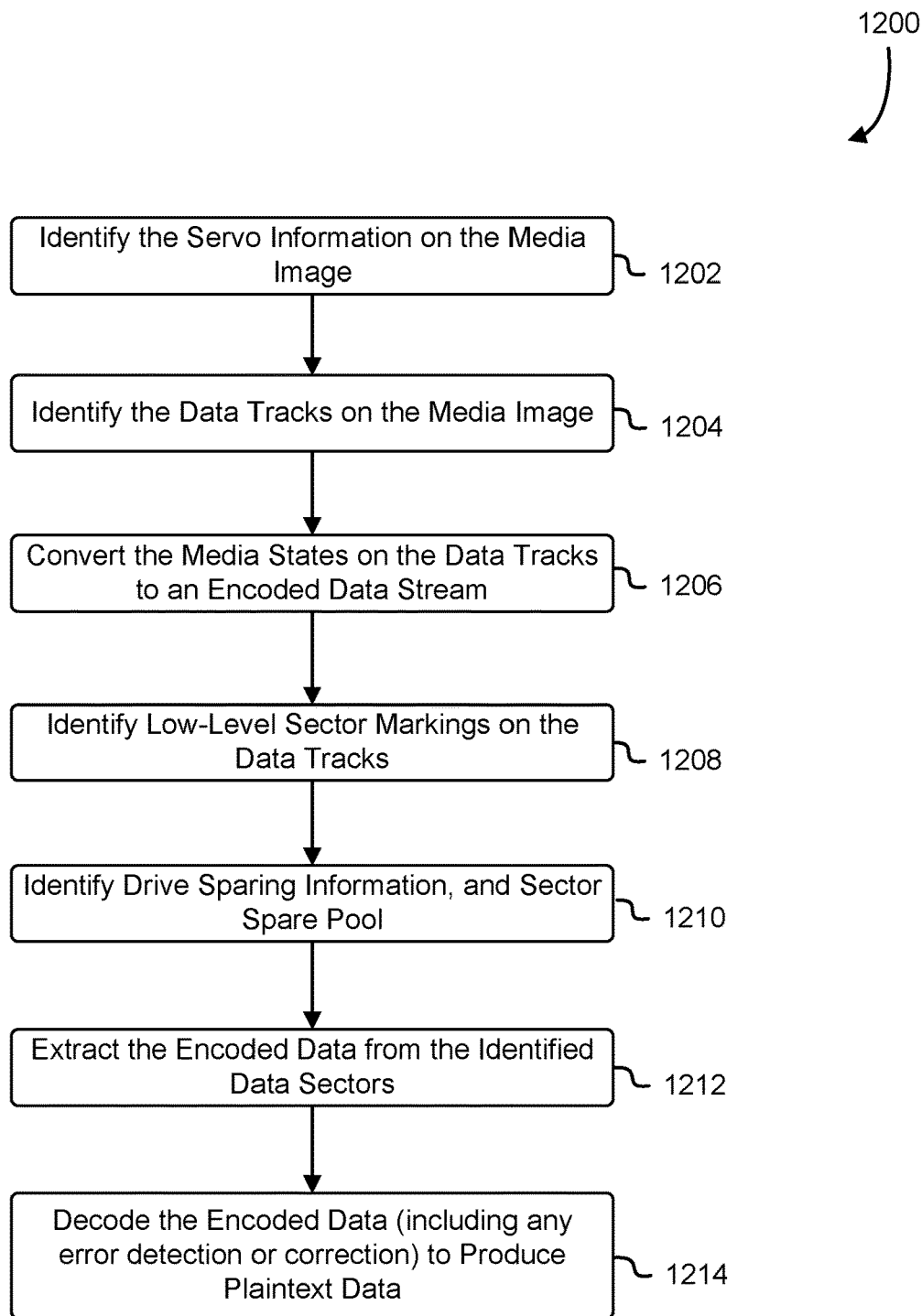
FIG. 12 is a flowchart that illustrates an example of a process that, as a result of being performed by a computer system, extracts a set of data from an image of the magnetic state of a portion of magnetic media, in accordance with an embodiment.

FIG. 12 is a flowchart that illustrates an example of a process that, as a result of being performed by a computer system, extracts a set of data from an image of the magnetic state of a piece of magnetic media, in accordance with an embodiment. Some or all of the process 1200 (or any other processes described, or variations and/or combinations of those processes) may be performed under the control of one or more computer systems configured with executable instructions and/or other data, and may be implemented as executable instructions executing collectively on one or more processors. The executable instructions and/or other data may be stored on a non-transitory computer-readable storage medium (e.g., a computer program persistently stored on magnetic, optical, or flash media).

For example, some or all of process 1200 may be performed by any suitable system, such as a server in a data center, by various components of the environment 1400 described in conjunction with FIG. 14, such as the one or more web servers 1406 or the one or more application servers 1408, by multiple computing devices in a distributed system of a computing resource service provider, or by any electronic client device such as the electronic client device 1402.

In an embodiment, at block 1202, the system identifies servo information on the media image. Servo information is information that represents a position on the piece of media at which the information is written. For example, disk drives may have embedded servo information or dedicated servo information. Dedicated servo information is information that is written on a single surface of a disk platter within a disk pack comprising multiple disks. Information on the surface containing the servo information is used to control a single set of interconnected heads, thereby providing position information for all surfaces. Embedded servo information is information interleaved with data on a single surface. In some examples, embedded servo information is written in an interspersed radial pattern, and each piece of servo information includes an automatic gain control section ("AGC"), a track encoding gray code, and analog fine servo information sometimes implemented as a quadrature code. In using the servo information, the system identifies 1204 data tracks on the media image. In some examples, tracks are arranged as concentric circles around the central axis of the media. In other examples, a single track may be arranged as a spiral around the central axis. For a piece of magnetic tape, tracks may be arranged as parallel stripes down the length of the tape or as a helical scan across the width of the tape.

In an embodiment, at block 1206, the system identifies the magnetic state of the media within the identified tracks and, based on the magnetic state, determines an encoded data stream present on each track. At block 1208, the system examines the encoded data stream to identify sector markings or headers that may be present. Sector markings or headers divide tracks into a plurality of sectors, where each sector has an identifying number and ordering with respect to other sectors. Sectors may be ordered with respect to other sectors on the track and also with respect to other sectors on other tracks by way of an interleave factor. The interleave factor specifies an angular shift between linked data sectors on adjacent tracks.

In an embodiment, at block 1210, the system identifies drive sparing information and any associated spare pools. Drive sparing information describes areas on the piece of magnetic media that are determined to be defective. A spare pool is a set of sectors on the magnetic media that may be used by the drive controller to substitute for defective sectors elsewhere on the piece of magnetic media. In general, when an end user commands a disk drive to a location that has been determined to be defective, the drive controller uses the drive-sparing information to identify a substitute location within the spare pool, and uses the substitute location instead of the requested location. This generally occurs without knowledge of the end-user. At block 1212, the system extracts the encoded data from the identified data sectors, taking into account any defective sectors mapped into the spare pool. The resulting encoded data can then be decoded 1214 in accordance with any magnetic-encoding scheme implemented by the drive controller to produce a set of plaintext data that represents what was originally written to the piece of magnetic media. For example, a bitstream sent to a magnetic disk drive is generally encoded in some way to limit the number of consecutive bits having the same state. An example of an encoding scheme would be run length limited encoding ("RLL"). The system reverses this encoding to acquire the data actually written to the disk.

In some examples, data is written to magnetic media in a way that includes error detection and correction capabilities. In some embodiments, the system exploits this encoding to correct any errors when reconstructing the data. There detection and correction capabilities may include simple mechanisms such as checksums and complex mechanisms such as multi-bit error correcting codes such as Reed-Solomon codes. In an embodiment, the system generates the resulting plaintext data in accordance with any error correcting and detecting capabilities facilitated by the data encoding present on the piece of magnetic media.

Note that one or more of the operations performed in 1200 may be performed in various orders and combinations, including in parallel.

Figure 13:
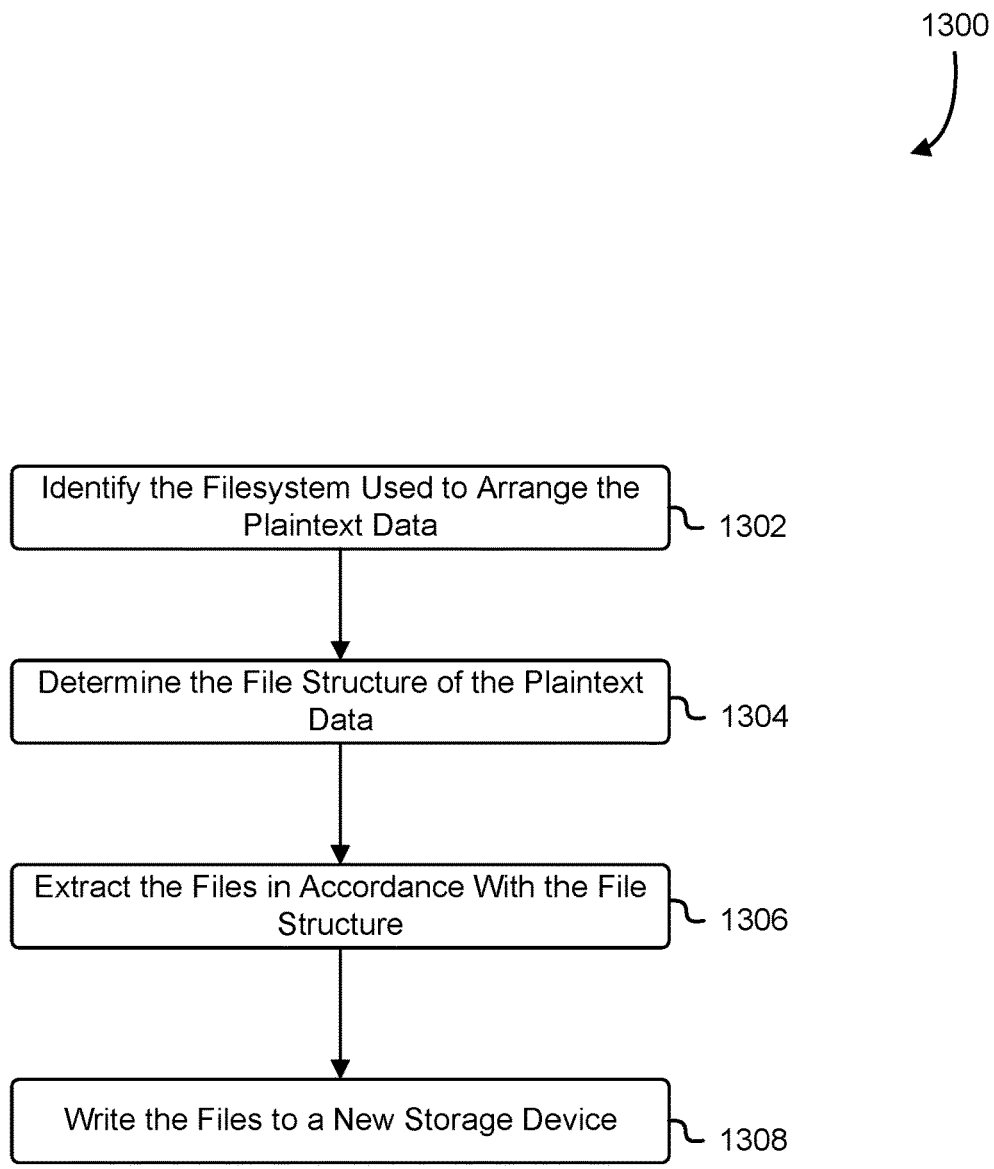
FIG. 13 is a flowchart that illustrates an example of a process that, as a result of being performed by a computer system, recovers a set of files from a set of plaintext data.

FIG. 13 is a flowchart that illustrates an example of a process that, as a result of being performed by a computer system, recovers a set of files from a set of plaintext data. Some or all of the process 1300 (or any other processes described, or variations and/or combinations of those processes) may be performed under the control of one or more computer systems configured with executable instructions and/or other data, and may be implemented as executable instructions executing collectively on one or more processors. The executable instructions and/or other data may be stored on a non-transitory computer-readable storage medium (e.g., a computer program persistently stored on magnetic, optical, or flash media).

For example, some or all of process 1300 may be performed by any suitable system, such as a server in a data center, by various components of the environment 1400 described in conjunction with FIG. 14, such as the one or more web servers 1406 or the one or more application servers 1408, by multiple computing devices in a distributed system of a computing resource service provider, or by any electronic client device such as the electronic client device 1402.

At block 1302, the system identifies the filesystem associated with the plaintext data extracted from the piece of magnetic media. In some examples, the filesystem is identified by prompting the user, and the user identifies the filesystem from a set of file structures. In other examples, the filesystem is identified by examining the data and locating information from which the filesystem can be inferred. For example, the system may examine the data associated with a master boot record and partition table, and infer a filesystem used from that information. In another example, the system may examine the data to identify particular structures such as inodes or file headers that are indicative of particular filesystems.

In an embodiment, at block 1304, the system examines the data and determines a file structure when interpreted with the rules of the identified file system. The file structure may include a directory structure, a list of filenames, a list of free and used data blocks, and file version information. At block 1306, the system extracts the files from the data in accordance with the file structure. In an embodiment, at block 1308, the resulting files are written to a new data storage device such as a hard disk drive, memory stick, or computer-readable media.

Note that one or more of the operations performed in 1300 may be performed in various orders and combinations, including in parallel.

Note that, in the context of describing disclosed embodiments, unless otherwise specified, use of expressions regarding executable instructions (also referred to as code, applications, agents, etc.) performing operations that "instructions" do not ordinarily perform unaided (e.g., transmission of data, calculations, etc.) denote that the instructions are being executed by a machine, thereby causing the machine to perform the specified operations.

FIG. 14 illustrates aspects of an example environment 1400 for implementing aspects in accordance with various embodiments. As will be appreciated, although a web-based environment is used for purposes of explanation, different environments may be used, as appropriate, to implement various embodiments. The environment includes an electronic client device 1402, which can include any appropriate device operable to send and/or receive requests, messages, or information over an appropriate network 1404 and convey information back to a user of the device. Examples of such client devices include personal computers, cell phones, handheld messaging devices, laptop computers, tablet computers, set-top boxes, personal data assistants, embedded computer systems, electronic book readers, and the like.

The environment 1400 in one embodiment is a distributed and/or virtual computing environment utilizing several computer systems and components that are interconnected via communication links, using one or more computer networks or direct connections. However, it will be appreciated by those of ordinary skill in the art that such a system could operate equally well in a system having fewer or a greater number of components than those illustrated in FIG. 14. Thus, the depiction in FIG. 14 should be taken as being illustrative in nature and not limiting to the scope of the disclosure.

The network 1404 can include any appropriate network, including an intranet, the Internet, a cellular network, a local area network, a satellite network or any other network, and/or combination thereof. Components used for such a system can depend at least in part upon the type of network and/or environment selected. Many protocols and components for communicating via such network 1404 are well known and will not be discussed in detail. Communication over the network 1404 can be enabled by wired or wireless connections and combinations thereof. In an embodiment, the network 1404 includes the Internet and/or other publicly-addressable communications network, as the environment 1400 includes one or more web servers 1406 for receiving requests and serving content in response thereto, although for other networks an alternative device serving a similar purpose could be used as would be apparent to one of ordinary skill in the art.

The illustrative environment 1400 includes one or more application servers 1408 and data storage 1410. It should be understood that there can be several application servers, layers or other elements, processes or components, which may be chained or otherwise configured, which can interact to perform tasks such as obtaining data from an appropriate data store. Servers, as used, may be implemented in various ways, such as hardware devices or virtual computer systems. In some contexts, "servers" may refer to a programming module being executed on a computer system. As used, unless otherwise stated or clear from context, the term "data store" or "data storage" refers to any device or combination of devices capable of storing, accessing, and retrieving data, which may include any combination and number of data servers, databases, data storage devices, and data storage media, in any standard, distributed, virtual, or clustered environment.

The one or more application servers 1408 can include any appropriate hardware, software and firmware for integrating with the data storage 1410 as needed to execute aspects of one or more applications for the electronic client device 1402, handling some or all of the data access and business logic for an application. The one or more application servers 1408 may provide access control services in cooperation with the data storage 1410 and is able to generate content including, text, graphics, audio, video, and/or other content usable to be provided to the user, which may be served to the user by the one or more web servers 1406 in the form of HyperText Markup Language (HTML), Extensible Markup Language (XML), JavaScript, Cascading Style Sheets (CSS), JavaScript Object Notation (JSON), and/or another appropriate client-side structured language. Content transferred to the electronic client device 1402 may be processed by the electronic client device 1402 to provide the content in one or more forms including forms that are perceptible to the user audibly, visually, and/or through other senses. The handling of all requests and responses, as well as the delivery of content between the electronic client device 1402 and the one or more application servers 1408, can be handled by the one or more web servers 1406 using PHP: Hypertext Preprocessor (PHP), Python, Ruby, Perl, Java, HTML, XML, JSON, and/or another appropriate server-side structured language in this example. Further, operations described as being performed by a single device may, unless otherwise clear from context, be performed collectively by multiple devices, which may form a distributed and/or virtual system.

Each server typically will include an operating system that provides executable program instructions for the general administration and operation of that server and typically will include a computer-readable storage medium (e.g., a hard disk, random access memory, read only memory, etc.) storing instructions that, when executed (i.e., as a result of being executed) by a processor of the server, allow the server to perform its intended functions.

The data storage 1410 can include several separate data tables, databases, data documents, dynamic data storage schemes, and/or other data storage mechanisms and media for storing data relating to a particular aspect of the present disclosure. For example, the data storage 1410 may include mechanisms for storing various types of data and user information 1416, which can be used to serve content to the electronic client device 1402. The data storage 1410 also is shown to include a mechanism for storing log data, such as application logs, system logs, access logs, and/or various other event logs, which can be used for reporting, analysis, or other purposes. It should be understood that there can be many other aspects that may need to be stored in the data storage 1410, such as page image information and access rights information, which can be stored in any of the above listed mechanisms as appropriate or in additional mechanisms in the data storage 1410. The data storage 1410 is operable, through logic associated therewith, to receive instructions from the one or more application servers 1408 and obtain, update, or otherwise process data in response thereto. The one or more application servers 1408 may provide static, dynamic, or a combination of static and dynamic data in response to the received instructions. Dynamic data, such as data used in web logs (blogs), shopping applications, news services, and other applications may be generated by server-side structured languages as described or may be provided by a content management system (CMS) operating on, or under the control of, the one or more application servers 1408.

In one embodiment, a user, through a device operated by the user, can submit a search request for a match to a particular search term. In this embodiment, the data storage 1410 might access the user information to verify the identity of the user and obtain information about items of that type. The information then can be returned to the user, such as in a results listing on a web page that the user is able to view via a browser on the electronic client device 1402. Information related to the particular search term can be viewed in a dedicated page or window of the browser. It should be noted, however, that embodiments of the present disclosure are not necessarily limited to the context of web pages, but may be more generally applicable to processing requests in general, where the requests are not necessarily requests for content.

The various embodiments further can be implemented in a wide variety of operating environments, which in some embodiments can include one or more user computers, computing devices, or processing devices that can be used to operate any of a number of applications. User or client devices can include any of a number of computers, such as desktop, laptop, or tablet computers running a standard operating system, as well as cellular, wireless, and handheld devices running mobile software and capable of supporting a number of networking and messaging protocols. Such a system also can include a number of workstations running any of a variety of commercially available operating systems and other known applications for purposes such as development and database management. These devices also can include other electronic devices, such as dummy terminals, thin-clients, gaming systems, and other devices capable of communicating via the network 1404. These devices also can include virtual devices such as virtual machines, hypervisors, and other virtual devices capable of communicating via the network 1404.

Various embodiments of the present disclosure utilize the network 1404 that would be familiar to those skilled in the art for supporting communications using any of a variety of commercially available protocols, such as Transmission Control Protocol/Internet Protocol (TCP/IP), User Datagram Protocol (UDP), protocols operating in various layers of the Open System Interconnection (OSI) model, File Transfer Protocol (FTP), Universal Plug and Play (UpnP), Network File System (NFS), and Common Internet File System (CIFS). The network 1404 can be, for example, a local area network, a wide-area network, a virtual private network, the Internet, an intranet, an extranet, a public switched telephone network, an infrared network, a wireless network, a satellite network, and any combination thereof. In some embodiments, connection-oriented protocols may be used to communicate between network endpoints. Connection-oriented protocols (sometimes called connection-based protocols) are capable of transmitting data in an ordered stream. Connection-oriented protocols can be reliable or unreliable. For example, the TCP protocol is a reliable connection-oriented protocol. Asynchronous Transfer Mode (ATM) and Frame Relay are unreliable connection-oriented protocols. Connection-oriented protocols are in contrast to packet-oriented protocols such as UDP that transmit packets without a guaranteed ordering.

In embodiments utilizing the one or more web servers 1406, the one or more web servers 1406 can run any of a variety of server or mid-tier applications, including Hypertext Transfer Protocol (HTTP) servers, FTP servers, Common Gateway Interface (CGI) servers, data servers, Java servers, Apache servers, and business application servers. The server(s) also may be capable of executing programs or scripts in response to requests from user devices, such as by executing one or more web applications that may be implemented as one or more scripts or programs written in any programming language, such as Java®, C, C# or C++, or any scripting language, such as Ruby, PHP, Perl, Python, or TCL, as well as combinations thereof. The server(s) may also include database servers, including those commercially available from Oracle®, Microsoft®, Sybase®, and IBM® as well as open-source servers such as MySQL, Postgres, SQLite, MongoDB, and any other server capable of storing, retrieving, and accessing structured or unstructured data. Database servers may include table-based servers, document-based servers, unstructured servers, relational servers, non-relational servers, or combinations of these and/or other database servers.

The environment 1400 can include a variety of data stores and other memory and storage media as discussed above. These can reside in a variety of locations, such as on a storage medium local to (and/or resident in) one or more of the computers or remote from any or all of the computers across the network 1404. In a particular set of embodiments, the information may reside in a storage-area network (SAN) familiar to those skilled in the art. Similarly, any necessary files for performing the functions attributed to the computers, servers or other network devices may be stored locally and/or remotely, as appropriate. Where a system includes computerized devices, each such device can include hardware elements that may be electrically coupled via a bus, the elements including, for example, a central processing unit (CPU or processor), an input device (e.g., a mouse, keyboard, controller, touch screen, or keypad), and an output device (e.g., a display device, printer, or speaker). Such a system may also include one or more storage devices, such as disk drives, optical storage devices, and solid-state storage devices such as random access memory (RAM) or read-only memory (ROM), as well as removable media devices, memory cards, flash cards, etc.

Such devices also can include a computer-readable storage media reader, a communications device (e.g., a modem, a network card (wireless or wired), an infrared communication device, etc.), and working memory as described above. The computer-readable storage media reader can be connected with, or configured to receive, a computer-readable storage medium, representing remote, local, fixed, and/or removable storage devices as well as storage media for temporarily and/or more permanently containing, storing, transmitting, and retrieving computer-readable information. The system and various devices also typically will include a number of software applications, modules, services, or other elements located within a working memory device, including an operating system and application programs, such as a client application or web browser. In addition, customized hardware might also be used and/or particular elements might be implemented in hardware, software (including portable software, such as applets), or both. Further, connection to other computing devices such as network input/output devices may be employed.

Storage media and computer readable media for containing code, or portions of code, can include any appropriate media known or used in the art, including storage media and communication media, such as, volatile and non-volatile, removable and non-removable media implemented in any method or technology for storage and/or transmission of information such as computer readable instructions, data structures, program modules, or other data, including RAM, ROM, Electrically Erasable Programmable Read-Only Memory (EEPROM), flash memory or other memory technology, Compact Disc Read-Only Memory (CD-ROM), digital versatile disk (DVD), or other optical storage, magnetic cassettes, magnetic tape, magnetic disk storage, or other magnetic storage devices, or any other medium which can be used to store the desired information and which can be accessed by the system device. Based on the disclosure and teachings provided, a person of ordinary skill in the art will appreciate other ways and/or methods to implement the various embodiments.

In the preceding and following description, various techniques are described. For purposes of explanation, specific configurations and details are set forth in order to provide a thorough understanding of possible ways of implementing the techniques. However, it will also be apparent that the techniques described below may be practiced in different configurations without the specific details. Furthermore, well-known features may be omitted or simplified to avoid obscuring the techniques being described.

The specification and drawings are, accordingly, to be regarded in an illustrative rather than a restrictive sense. However, it will be evident that various modifications and changes may be made thereunto without departing from the broader spirit and scope of the invention as set forth in the claims. Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the invention to the specific form or forms disclosed, but on the contrary, the intention is to cover all modifications, alternative constructions, and equivalents falling within the spirit and scope of the invention, as defined in the appended claims.

The use of the terms "a," "an," "the," and similar referents in the context of describing the disclosed embodiments (especially in the context of the following claims) are to be construed to cover both the singular and the plural, unless otherwise indicated or clearly contradicted by context. The terms "comprising," "having," "including," and "containing" are to be construed as open-ended terms (i.e., meaning "including, but not limited to,") unless otherwise noted. The term "connected," where unmodified and referring to physical connections, is to be construed as partly or wholly contained within, attached to, or joined together, even if there is something intervening. Recitation of ranges of values are merely intended to serve as a shorthand method of referring individually to each separate value falling within the range, unless otherwise indicated and each separate value is incorporated into the specification as if it were individually recited. The use of the term "set" (e.g., "a set of items") or "subset" unless otherwise noted or contradicted by context, is to be construed as a nonempty collection comprising one or more members. Further, unless otherwise noted or contradicted by context, the term "subset" of a corresponding set does not necessarily denote a proper subset of the corresponding set, but the subset and the corresponding set may be equal. The use of the phrase "based on," unless otherwise explicitly stated or clear from context, means "based at least in part on" and is not limited to "based solely on."

Conjunctive language, such as phrases of the form "at least one of A, B, and C," or "at least one of A, B and C," is understood with the context as used in general to present that an item, term, etc., may be either A or B or C, or any nonempty subset of the set of A and B and C, unless specifically stated otherwise or otherwise clearly contradicted by context. For instance, in the illustrative example of a set having three members, the conjunctive phrases "at least one of A, B, and C" and "at least one of A, B and C" refer to any of the following sets: {A}, {B}, {C}, {A, B}, {A, C}, {B, C}, {A, B, C}. Thus, such conjunctive language is not generally intended to imply that certain embodiments require at least one of A, at least one of B and at least one of C each to be present. In addition, unless otherwise noted or contradicted by context, the term "plurality" indicates a state of being plural (e.g., "a plurality of items" indicates multiple items). The number of items in a plurality is at least two, but can be more when so indicated either explicitly or by context.

Operations of processes described can be performed in any suitable order unless otherwise indicated or otherwise clearly contradicted by context. Processes described (or variations and/or combinations thereof) may be performed under the control of one or more computer systems configured with executable instructions and may be implemented as code (e.g., executable instructions, one or more computer programs or one or more applications) executing collectively on one or more processors, by hardware or combinations thereof. The code may be stored on a computer-readable storage medium, for example, in the form of a computer program comprising instructions executable by one or more processors. The computer-readable storage medium may be non-transitory. In some embodiments, the code is stored on a set of one or more non-transitory computer-readable storage media having stored thereon executable instructions that, when executed (i.e., as a result of being executed) by one or more processors of a computer system, cause the computer system to perform operations described herein. The set of non-transitory computer-readable storage media may comprise multiple non-transitory computer-readable storage media and one or more of individual non-transitory storage media of the multiple non-transitory computer-readable storage media may lack all of the code while the multiple non-transitory computer-readable storage media collectively store all of the code. Further, in some embodiments, the executable instructions are executed such that different instructions are executed by different processors. As an illustrative example, a non-transitory computer-readable storage medium may store instructions. A main CPU may execute some of the instructions and a graphics processor unit may execute other of the instructions. Generally, different components of a computer system may have separate processors and different processors may execute different subsets of the instructions.

Accordingly, in some embodiments, computer systems are configured to implement one or more services that singly or collectively perform operations of processes described herein. Such computer systems may, for instance, be configured with applicable hardware and/or software that enable the performance of the operations. Further, computer systems that implement various embodiments of the present disclosure may, in some embodiments, be single devices and, in other embodiments, be distributed computer systems comprising multiple devices that operate differently such that the distributed computer system performs the operations described and such that a single device may not perform all operations.

The use of any examples, or exemplary language (e.g., "such as") provided, is intended merely to better illuminate embodiments of the invention and does not pose a limitation on the scope of the invention unless otherwise claimed. No language in the specification should be construed as indicating any non-claimed element as essential to the practice of the invention.

Embodiments of this disclosure are described, including the best mode known to the inventors for carrying out the invention. Variations of those embodiments may become apparent to those of ordinary skill in the art upon reading the foregoing description. The inventors expect skilled artisans to employ such variations as appropriate and the inventors intend for embodiments of the present disclosure to be practiced otherwise than as specifically described. Accordingly, the scope of the present disclosure includes all modifications and equivalents of the subject matter recited in the claims appended hereto as permitted by applicable law. Moreover, although above-described elements may be described in the context of certain embodiments of the specification, unless stated otherwise or otherwise clear from context, these elements are not mutually exclusive to only those embodiments in which they are described; any combination of the above-described elements in all possible variations thereof is encompassed by the scope of the present disclosure unless otherwise indicated or otherwise clearly contradicted by context.

All references, including publications, patent applications, and patents, cited are hereby incorporated by reference to the same extent as if each reference were individually and specifically indicated to be incorporated by reference and were set forth in its entirety.

What is claimed is:

1. A computer-implemented method, comprising:
   obtaining an image that represents the magnetic state of a portion of magnetic tape media;
   identifying a region of the image that represents binary user data stored on the portion of magnetic tape media;
   determining the binary user data based on the magnetic state of the region;
   provide the binary user data;
   wherein the image is obtained by at least:
   moving a magneto-optic image sensor over the surface of the portion of magnetic tape media;
   obtaining a plurality of overlapping images, each image of the plurality capturing a portion of the portion of magnetic tape media; and
   stitching the plurality of overlapping images together to form the image.

2. The computer-implemented method of claim 1, further comprising:
   determining a level of contrast for the image; and
   adjusting the distance from a magneto-optic image sensor to the surface of the portion of magnetic tape media to increase the level of contrast for a subsequent image obtained with the magneto-optic image sensor.

3. The computer-implemented method of claim 1, further comprising:
   identifying magnetic markings on the portion of magnetic tape media that represent physical-location information on the portion of magnetic tape media;
   determining a location of a data track based on the magnetic markings; and
   determining a portion of the binary user data based on the magnetic state of the portion of magnetic tape media on the data track.

4. The computer-implemented method of claim 1, further comprising storing the binary user data to computer readable media.

5. The computer-implemented method of claim 1, further comprising:
   obtaining image data from a magneto-optic image sensor; and
   generating the image based at least in part on the image data.

6. A system, comprising:
   one or more processors; and
   memory including executable instructions that, if executed by the one or more processors, cause the system to:
   obtain servo information from an image that represents a magnetic state of a portion of magnetic media, the image created by combining at least two partly overlapping images obtained from a magneto-optic sensor;
   use the servo information to determine a region of the image that represents user data stored on the portion of magnetic media;
   determine the user data represented by the region; and
   provide the user data.

7. The system of claim 6, further comprising:
a turntable capable of rotating the portion of magnetic media; and
a first actuator capable of moving the magneto-optic image sensor approximately radially with respect to the turntable,
wherein the executable instructions further cause the system to:
move the magneto-optic image sensor over the surface of the portion of magnetic media using the turntable and the first actuator; and
acquire, using the magneto-optic image sensor, a plurality of images where each image in the plurality of images represents the magnetic state of a portion of the portion of magnetic media.

8. The system of claim 7, further comprising:
a second linear actuator capable of adjusting a distance between the surface of the portion of magnetic media and the magneto-optic image sensor; and
wherein the executable instructions further cause the system to adjust, using the second linear actuator, a perpendicular distance between the portion of magnetic media and the magneto-optic image sensor.

9. The system of claim 7, wherein the executable instructions further cause the system to obtain the image by combining the plurality of images into a composite image.

10. The system of claim 7, wherein the magneto-optic image sensor includes a focusing element that is able to adjust a focal length of the magneto-optic image sensor.

11. The system of claim 6, further comprising:
an XY traverse mechanism capable of moving the magneto-optic image sensor over the surface of the portion of magnetic media;
wherein the executable instructions further cause the system to:
move the magneto-optic image sensor over the surface of the portion of magnetic media using the XY traverse mechanism; and
acquire, using the magneto-optic image sensor, a plurality of images such that each image in the plurality of images represents the magnetic state of a portion of the portion of magnetic media.

12. A system, comprising:
one or more processors; and
memory including executable instructions that, if executed by the one or more processors, cause the system to:
obtain servo information from an image that represents a magnetic state of a portion of magnetic media;
use the servo information to determine a region of the image that represents user data stored on the portion of magnetic media;
determine the user data represented by the region;
provide the user data;
wherein:
the portion of magnetic media is a magnetic tape wound on a source reel; and
a magneto-optic image sensor is positioned to capture the image prior to the portion of magnetic media being unwound from the source reel.

13. A non-transitory computer-readable storage medium having stored thereon executable instructions that, if executed by one or more processors of a computer system, cause the computer system to at least:
obtain an image that represents the magnetic state of a portion of magnetic media, the image created by combining at least two partly overlapping images obtained from a magneto-optic sensor;
identify, within the image, servo information on the portion of magnetic media;
based at least in part on the servo information, identify a region of the image that represents user data stored on the portion of magnetic media;
determine the user data represented by the region; and
provide the user data.

14. The non-transitory computer-readable storage medium of claim 13, wherein:
the portion of magnetic media is a magnetic tape; and
the servo information comprises magnetic markings that identify one or more data tracks on the magnetic tape.

15. The non-transitory computer-readable storage medium of claim 13, wherein:
the portion of magnetic media is a disk; and
the servo information encodes a track identifier on the portion of magnetic media.

16. The non-transitory computer-readable storage medium of claim 15, wherein the executable instructions that further cause the computer system to:
obtain sector-sparing information from the image, the sector-sparing information describing a set of defective sectors on the portion of magnetic media and a replacement sector for each defective sector in the set of defective sectors;
determine a sector mapping based on the sector sparing information and the track identifier; and
determine the user data based at least in part on the sector mapping.

17. The non-transitory computer-readable storage medium of claim 13, wherein the executable instructions further include instructions that cause the computer system to:
acquire, a first set of images that, when combined to form a first composite image, cover a first approximately linear stripe of the portion of magnetic media;
acquire, a second set of images that, when combined to form a second composite image, cover a second approximately linear stripe of the portion of magnetic media, the first approximately linear stripe overlapping the second approximately linear stripe; and
obtain an image that represents the magnetic state of the portion of magnetic media by at least combining the first composite image and the second composite image.

18. The non-transitory computer-readable storage medium of claim 13, wherein the executable instructions further include instructions that cause the computer system to:
acquire, a first set of images that, when combined to form a first composite image, cover a first approximately circular arc of the portion of magnetic media;
acquire, a second set of images that, when combined to form a second composite image, cover a second approximately circular arc of the portion of magnetic media, the first approximately circular arc overlapping the second approximately circular arc; and
obtain the image that represents the magnetic state of the portion of magnetic media by at least combining the first composite image and the second composite image.

19. The non-transitory computer-readable storage medium of claim 13, wherein the executable instructions further include instructions that cause the computer system to:

acquire a first set of images that, when combined to form a first composite image, cover a first radial stripe of the portion of magnetic media;

acquire a second set of images that, when combined to form a second composite image, cover a second radial stripe of the portion of magnetic media, the second radial stripe overlapping the first radial stripe; and obtain the image that represents the magnetic state of the portion of magnetic media by at least combining the first composite image and the second composite image.

* * * * *